(12) United States Patent
Kodama et al.

(10) Patent No.: US 7,245,978 B2
(45) Date of Patent: Jul. 17, 2007

(54) MANAGING APPARATUS FOR MANAGING ASSISTING WORK TO ASSIST SUBSTRATE-RELATED-WORK PERFORMING SYSTEM, AND MANAGING PROGRAM FOR MANAGING ASSISTING WORK TO ASSIST SUBSTRATE-RELATED-WORK PERFORMING SYSTEM

(75) Inventors: Seigo Kodama, Ama-gun (JP); Hiroyuki Haneda, Chita (JP)

(73) Assignee: Fuji Machine Mfg. Co., Ltd., Chiryu-shi (JP)

( * ) Notice: Subject to any disclaimer, the term of this patent is extended or adjusted under 35 U.S.C. 154(b) by 0 days.

(21) Appl. No.: 10/564,815

(22) PCT Filed: Jul. 13, 2004

(86) PCT No.: PCT/JP2004/009956

§ 371 (c)(1),
(2), (4) Date: Feb. 14, 2006

(87) PCT Pub. No.: WO2005/009101

PCT Pub. Date: Jan. 27, 2005

(65) Prior Publication Data

US 2006/0200264 A1 Sep. 7, 2006

(30) Foreign Application Priority Data

Jul. 18, 2003 (JP) .............................. 2003-199391

(51) Int. Cl.
*G06F 19/00* (2006.01)
*G05B 19/18* (2006.01)

(52) U.S. Cl. ...................... 700/100; 700/101; 700/111; 700/114; 700/115; 700/9
(58) Field of Classification Search .................. 700/9, 700/99–101, 111, 114, 115, 180, 182
See application file for complete search history.

(56) References Cited

U.S. PATENT DOCUMENTS

| 5,093,794 A * | 3/1992 | Howie et al. ............... 700/100 |
| 6,417,760 B1 * | 7/2002 | Mabuchi et al. ............. 340/5.3 |
| 6,459,946 B1 * | 10/2002 | Villanova et al. ........... 700/111 |

FOREIGN PATENT DOCUMENTS

| JP | A 9-223896 | 8/1997 |
| JP | A 11-150398 | 6/1999 |
| JP | A 2000-331069 | 11/2000 |
| JP | A 2002-83028 | 3/2002 |
| JP | A 2002-164697 | 6/2002 |
| JP | A 2003-2444 | 1/2003 |

* cited by examiner

*Primary Examiner*—Leo Picard
*Assistant Examiner*—Sean Shechtman
(74) *Attorney, Agent, or Firm*—Oliff & Berridge, PLC

(57) ABSTRACT

Assisting-work management apparatus and an assisting-work management program for performing the assisting work in a substrate work machine system efficiently by a plurality of workers. A worker determining section (140) determines a worker to perform an objective work obtained according to assisting work occurrence information acquired by an assisting work occurrence information acquiring section (110) and a work informing section (180) informs the determined worker of the objective work. The workers determining section (140) can determine the worker of the objective work appropriately based on set worker information, current worker information, the worker intension, and the like.

16 Claims, 16 Drawing Sheets

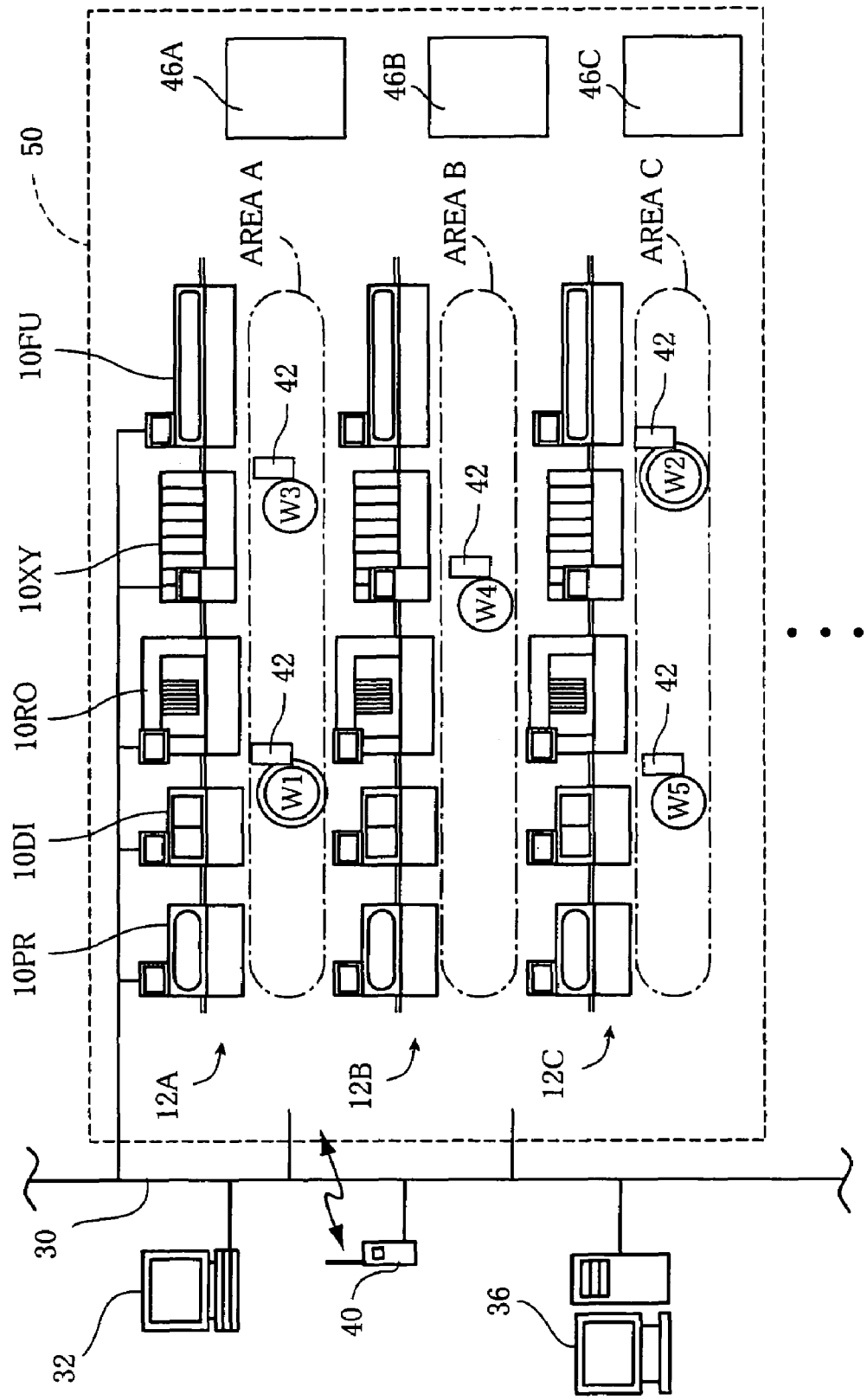

FIG.2

(UNITS: SECONDS)

| NAME OF WORK | SORT | OBJECTIVE MACHINE | STOPPING OF MACHINE | NEEDED SKILL LEVEL | STANDARD NEEDED TIME | ARRIVAL-TIME ADJUSTING TIME | PRIORITY ADJUSTING TIME | MATERIAL TAKING TIME |
|---|---|---|---|---|---|---|---|---|
| SOLDER SUPPLY | SUPPLYING | SCREEN-PRINTING MACHINE | YES | H | 180 | -30 | -30 | 0 |
| SYRINGE REPLACEMENT | SUPPLYING | ADHESIVE APPLYING MACHINE | YES | L | 150 | -30 | -30 | 0 |
| FEEDER REPLACEMENT RO | SUPPLYING | SCREEN-PRINTING MACHINE | NO | L | 30 | 0 | 60 | 60 |
| FEEDER REPLACEMENT XY | SUPPLYING | COMPONENT MOUNTING MACHINE | YES | L | 60 | -30 | -30 | 60 |
| REEL REPLACEMENT XY | SUPPLYING | COMPONENT MOUNTING MACHINE | NO | L | 40 | -120 | 60 | 60 |
| NOZZLE REPLACEMENT XY | RECOVERING | COMPONENT MOUNTING MACHINE | YES | H | 60 | — | — | 0 |
| IMAGE-RECOGNITION-CONDITION ADJUSTMENT | RECOVERING | COMPONENT MOUNTING MACHINE | YES | H | 300 | — | — | 0 |
| SOLDER-AMOUNT ADJUSTMENT | RECOVERING | SCREEN-PRINTING MACHINE | YES | H | 300 | — | — | 0 |
| HEATING-CONDITION ADJUSTMENT | RECOVERING | REFLOW FURNACE | YES | H | 300 | — | — | 0 |

FIG. 3

| WORKER No. | WORKER SKILL LEVEL | RESPONSIBILITY SECTION |
|---|---|---|
| W1 | H | A, B, C |
| W2 | H | A, B, C |
| W3 | L | A, B, C |
| W4 | L | A, B, C |
| W5 | L | A, B, C |

FIG. 4

| WORKER No. | WORKING STATE | CURRENT POSITION | ASSIGNED WORK | SCHEDULED STARTING TIME OF ASSIGNED WORK | SCHEDULED FINISHING TIME OF ASSIGNED WORK | WORK FINISHING POSITION | TEMPORARILY ASSIGNED WORK | WORKER INTENTION | TOTAL TIME OF ACTUAL WORKS | FINISHING TIME OF PREVIOUS WORK |
|---|---|---|---|---|---|---|---|---|---|---|
| W1 | WAITING | A | | | | A | (N7) | (Y) | 63 MIN | 13:42:20 |
| W2 | WAITING | C | | | | C | (N7) | (Y) | 66 MIN | 13:51:10 |
| W3 | WAITING | A | N3, N6 | 14:00:10 | 14:03:30 | A | | | 224 MIN | 13:55:40 |
| W4 | WAITING | B | N2 | 14:00:40 | 14:02:40 | B | | | 231 MIN | 13:57:20 |
| W5 | WORKING | C | N1, N4, N5 | 13:59:20 | 14:03:40 | C | | | 228 MIN | 13:56:50 |

FIG. 5

| WORK ID | WORK-OBJECT CODE | WORK NAME | PRIORITY-ORDER TIME | RECOM-MENDED ARRIVAL TIME | MATERIAL SHORTAGE TIME | STANDARD NEEDED TIME | MATERIAL CODE | NEEDED SKILL LEVEL | RESPONSIBLE WORKER | NEAR CONTINUOUS WORK |
|---|---|---|---|---|---|---|---|---|---|---|
| N1 | C-XY-507 | REEL REPLACEMENT | 14:01:20 | 14:00:20 | 14:02:20 | 40 | C-416 | L | W5 | 2 |
| N2 | B-XY-315 | FEEDER REPLACEMENT XY | 14:01:40 | 14:01:40 | 14:02:10 | 60 | I-266 | L | W4 | 0 |
| N3 | A-XY-306 | REEL REPLACEMENT | 14:02:10 | 14:01:10 | 14:03:10 | 40 | C-556 | L | W3 | 1 |
| N4 | C-XY-102 | REEL REPLACEMENT | 14:02:30 | 14:01:30 | 14:03:30 | 40 | C-492 | L | W5 | N1 |
| N5 | C-XY-411 | FEEDER REPLACEMENT XY | 14:02:40 | 14:02:40 | 14:03:10 | 60 | P-646 | L | W5 | N1 |
| N6 | A-RO-116 | FEEDER REPLACEMENT RO | 14:04:00 | 14:03:00 | 14:03:00 | 30 | C-376 | L | W3 | N3 |
| N7 | B-PR-CH | SOLDER SUPPLY | 14:04:30 | 14:04:30 | 14:05:00 | 180 | CH-08 | H | (W1) | (0) |
| N8 | C-XY-213 | FEEDER REPLACEMENT XY | 14:05:40 | 14:05:40 | 14:06:10 | 60 | I-461 | L | (W5) | (1) |
| N9 | B-XY-504 | REEL REPLACEMENT | 14:05:50 | 14:04:50 | 14:06:50 | 40 | C-496 | L | (W4) | (1) |
| N10 | B-XY-607 | REEL REPLACEMENT | 14:06:50 | 14:05:50 | 14:07:50 | 40 | P-752 | L | (W4) | (N9) |
| N11 | A-DI-GL1 | SYRINGE REPLACEMENT | 14:07:00 | 14:07:00 | 14:07:30 | 150 | GL-60 | L | (W3) | (0) |
| N12 | C-RO-205 | FEEDER REPLACEMENT RO | 14:08:00 | 14:07:00 | 14:07:00 | 30 | C-256 | L | (W5) | (N8) |
| N13 | A-XY-612 | FEEDER REPLACEMENT XY | 14:08:00 | 14:08:00 | 14:08:30 | 60 | T-615 | L | (W4) | (1) |
| N14 | C-PR-CH | SOLDER SUPPLY | 14:09:10 | 14:09:10 | 14:09:40 | 180 | CH-08 | H | (W2) | (0) |
| N15 | A-XY-203 | REEL REPLACEMENT | 14:10:20 | 14:09:20 | 14:11:20 | 40 | T-344 | L | (W4) | (N13) |

FIG.6

| WORK ID | WORK-OBJECT CODE | WORK NAME | URGENCY DEGREE | OCCURRENCE TIME | STANDARD NEEDED TIME | REPLACEMENT COMPONENT CODE | RESPONSIBLE WORKER | SIMULTANEOUS WORK |
|---|---|---|---|---|---|---|---|---|
| E1 | C-XY-4N3 | NOZZLE REPLACEMENT | L | 14:00:10 | 60 | NX12 | (W2) | (N5) |

FIG. 12

| WORKER No. | WORKING STATE | CURRENT POSITION | ASSIGNED WORK | SCHEDULED STARTING TIME OF ASSIGNED WORK | SCHEDULED FINISHING TIME OF ASSIGNED WORK | WORK FINISHING POSITION | TEMPORARILY ASSIGNED WORK | WORKER INTENTION | TOTAL TIME OF ACTUAL WORKS | FINISHING TIME OF PREVIOUS WORK |
|---|---|---|---|---|---|---|---|---|---|---|
| W1 | WAITING | A | N7 | 14:04:30 | 14:07:30 | B | | | 63 MIN | 13:42:20 |
| W2 | WAITING | C | | | | C | | | 66 MIN | 13:51:10 |
| W3 | WORKING | A | N3, N6 | 14:00:10 | 14:03:30 | A | | | 224 MIN | 13:55:40 |
| W4 | WAITING | B | N2 | 14:00:40 | 14:02:40 | B | | | 231 MIN | 13:57:20 |
| W5 | WAITING | C | N4, N5 | 14:01:30 | 14:03:40 | C | (N8) | (Y) | 230 MIN | 14:01:00 |

FIG.14

| WORK ID | WORK-OBJECT CODE | WORK NAME | URGENCY DEGREE | OCCURRENCE TIME | STANDARD NEEDED TIME | REPLACEMENT-COMPONENT CODE | RESPONSIBLE WORKER | SIMULTANEOUS WORK |
|---|---|---|---|---|---|---|---|---|
| E2 | C-RO-PC | IMAGE-RECOGNITION-CONDITION ADJUSTMENT | H | 14:04:20 | 300 | | (W2) | |

FIG. 15

| WORKER No. | WORKING STATE | CURRENT POSITION | ASSIGNED WORK | SCHEDULED STARTING TIME OF ASSIGNED WORK | SCHEDULED FINISHING TIME OF ASSIGNED WORK | WORK FINISHING POSITION | TEMPORARILY ASSIGNED WORK | WORKER INTENTION | TOTAL TIME OF ACTUAL WORKS | FINISHING TIME OF PREVIOUS WORK |
|---|---|---|---|---|---|---|---|---|---|---|
| W1 | WAITING | B | | | | B | | | 63 MIN | 13:42:20 |
| W2 | WAITING | C | E1 | 14:02:40 | 14:03:40 | C | | | 66 MIN | 13:51:10 |
| W3 | WAITING | A | N3, N6 | 14:00:10 | 14:03:30 | A | | | 224 MIN | 13:55:40 |
| W4 | WAITING | B | N2 | 14:00:40 | 14:02:40 | B | | | 231 MIN | 13:57:20 |
| W5 | WAITING | C | N1, N4, N5 | 13:59:20 | 14:03:40 | C | | | 228 MIN | 13:56:50 |

FIG. 16

| WORKER No. | WORKING STATE | CURRENT POSITION | ASSIGNED WORK | SCHEDULED STARTING TIME OF ASSIGNED WORK | SCHEDULED FINISHING TIME OF ASSIGNED WORK | WORK FINISHING POSITION | TEMPORARILY ASSIGNED WORK | WORKER INTENTION | TOTAL TIME OF ACTUAL WORKS | FINISHING TIME OF PREVIOUS WORK |
|---|---|---|---|---|---|---|---|---|---|---|
| W1 | WAITING | B | N7 | 14:04:30 | 14:07:30 | B | | | 63 MIN | 13:42:20 |
| W2 | WAITING | C | | | | C | | | 67 MIN | 14:03:40 |
| W3 | WAITING | A | N11 | 14:07:00 | 14:09:30 | A | | | 226 MIN | 14:03:30 |
| W4 | WAITING | B | N9, N10, N13, N15 | 14:03:50 | 14:10:00 | B | | | 233 MIN | 14:02:40 |
| W5 | WAITING | C | N8, N12 | 14:04:40 | 14:07:30 | C | | | 232 MIN | 14:03:40 |

MANAGING APPARATUS FOR MANAGING ASSISTING WORK TO ASSIST SUBSTRATE-RELATED-WORK PERFORMING SYSTEM, AND MANAGING PROGRAM FOR MANAGING ASSISTING WORK TO ASSIST SUBSTRATE-RELATED-WORK PERFORMING SYSTEM

TECHNICAL FIELD

The present invention relates to a managing apparatus, a managing method, and a managing program each for managing an assisting work that is a work to assist a substrate-related-operation performing machine performing an operation related to a circuit substrate such as a printed wiring board, and that is carried out by a worker.

BACKGROUND ART

An electronic circuit is assembled by using various substrate-related-operation performing machines. Those substrate-related-operation performing machines are, for example, a solder printing machine that prints solder cream on a circuit substrate; an adhesive applying machine that applies adhesive to a circuit substrate; and a component mounting machine that mounts circuit components such as electronic components on a circuit substrate. Those substrate-related-operation performing machines need various assisting works that are carried out by workers; such as a maintenance work, a material supplying work, a re-setting work, or a recovering work. Above all, the material supplying work is an assisting work to supply solder cream, adhesive, or circuit components. If the material supplying work is not smoothly carried out, then a time duration in which an operation of a substrate-related-operation performing machine is stopped is increased, and accordingly an operation efficiency of the machine is decreased. In addition, the recovering work is an assisting work to repair a failure of a substrate-related-operation performing machine, such as an urgency stop, production of a defective product, or lowering of an operation speed, and restore the machine to its normal condition. If a substrate-related-operation performing machine fails, then a worker needs to quickly deal with the failure.

Of the assisting works, the material supplying work is carried out frequently, for many objective machines. Therefore, it is difficult to efficiently manage those material supplying works. To smoothly carry out material supplying works, Patent Document 1 proposes to predict a time when electronic components will run short in an electronic-component mounting machine and inform, 5 minutes before the predicted time, a worker responsible for the machine, of a number representing a position where components are to be supplied, and a sort of the components. In addition, Patent Document 2 proposes to inform all workers of information including a predicted time when electronic components will run short.

Patent Document 1: Japanese Patent Application Publication No. 9-223896
Patent Document 2: Japanese Patent Application Publication No. 2002-164697

DISCLOSURE OF THE INVENTION

In the above-described prior art, the time when the electronic components will run short in the electronic-component mounting machine is predicted, and the workers are informed of the predicted time. However, though the workers are plural, who of the workers should carry out which of the assisting works is not determined, and the workers are informed of just the predicted time. Therefore, the assisting works cannot be carried out at a sufficiently high efficiency.

It is therefore an object of the present invention to provide an assisting-work managing apparatus and an assisting-work managing program each of which allows an assisting work of assisting a substrate-related-operation performing machine to be carried out efficiently. This object may be achieved according to any of the following modes of the present invention in the form of an assisting-work managing apparatus and an assisting-work managing program each of which is numbered like the appended claims and may depend from the other mode or modes, where appropriate, to indicate and clarify possible combinations of technical features. It is, however, to be understood that the present invention is not limited to the technical features or any combinations thereof that will be described below for illustrative purposes only. It is to be further understood that a plurality of features included in any one of the following modes of the invention are not necessarily provided altogether, and that the invention may be embodied without at least one of the features described with respect to each of the modes.

(1) A managing apparatus for managing an assisting work to assist a substrate-related-operation performing system comprising a plurality of substrate-related-operation performing machines each of which performs a substrate-related operation that is related to a circuit substrate, the assisting work being carried out, as needed, when the substrate-related-operation performing system is operated, the managing apparatus assigning, each time a need to carry out the assisting work occurs, the assisting work to one of a plurality of workers, the managing apparatus being characterized by comprising
an assisting-work occurrence information obtaining portion which obtains assisting-work occurrence information which is related to occurrence of a need to carry out at least one assisting work; and
a worker determining portion which determines one of the workers who is to carry out said at least one assisting work as at least one objective work, so that said at least one objective work is assigned to said one worker.

The substrate-related-operation performing system that is managed by the present assisting-work managing apparatus may comprise various substrate-related-operation performing machines, such as a solder printing machine, an adhesive applying machine (also called an adhesive dispenser), a component mounting machine, a reflow furnace, an inspection performing machine, or a substrate conveying machine. Alternatively, the substrate-related-operation performing system may, comprise a substrate-related-operation performing line including a plurality of substrate-related-operation performing machines that are arranged in an array and that sequentially perform respective operations related to a single circuit substrate.

The assisting work is carried out by a worker to assist a substrate-related-operation performing machine. The assisting work is, for example, a maintenance work, a material supplying work, a re-setting work, or a recovering work. The maintenance work is an assisting work to keep a substrate-related-operation performing machine in a good condition and thereby allow the machine to smoothly perform a substrate-related operation, and it is, for example, periodic inspection, oiling, replacement of part(s), or adjustment. The material supplying work is, as described above, a work to supply material (components, parts, etc.) that are consumed or worn in a substrate-related operation. The re-setting work is a work to change sorts of circuit substrates with each other so that operations may be performed with respect to a new sort of circuit substrates. The re-setting work is, for example, modification of a control program of a substrate-related-operation performing machine; adjustment of a substrate holding device of a substrate-related-operation performing machine; replacement of a screen of a solder printing machine; or changing of a sort of components set in a component supplying device of a component mounting machine. The recovering work is, as described above, a work to remove a cause of a failure of a substrate-related-operation performing machine. The failure of substrate-related-operation performing machine is, for example, a bad operation result, such as missing of component(s) from an assembled electronic circuit, mounting of component(s) at incorrect position(s) on an assembled electronic circuit, or production of defective product(s) having, e.g., a defective portion such as solder bridge; a problem of an operation of a substrate-related-operation performing machine, such as occurrence of error(s) to an image processing step; or a problem of a substrate-related-operation performing machine itself, such as breaking of a suction nozzle or a failure of a component feeder.

In the case where there are a plurality of workers who carry out assisting works, it is required that the assisting works be appropriately assigned to the workers. For example, if one assisting work is carried out by more than necessary workers, then respective operation efficiencies of the workers may be lowered. In addition, if a certain assisting work is not carried out by any workers because all workers misunderstand that the assisting work has already been carried out by someone else, then an operation time of a substrate-related-operation performing machine may be decreased. The present assisting-work managing apparatus determines a worker who is to carry out an assisting work. Therefore, each worker can clearly recognize an assisting work to be carried out by himself or herself. Thus, the operation efficiency of each worker and the operation time of each substrate-related- operation performing machine can be improved.

The assisting-work occurrence information is information related to occurrence of a need to carry out an assisting work, e.g., an assisting work to be quickly carried out, or an assisting work to be carried out in future. The assisting-work occurrence information may be just a number (No.) identifying an assisting work. However, it is preferred, for assigning the assisting work to an appropriate worker, that the assisting-work occurrence information include information related to, e.g., an object of the assisting work, a sort of the assisting work, and a time when the assisting work is to be carried out. The information related to the object of the assisting work is information specifying an object on which the assisting work is to be carried out, and the object may be a substrate-related-operation performing machine itself, a specific device employed by a specific substrate-related-operation performing machine, or a specific material used by a specific substrate-related-operation performing machine. The information related to the sort of the assisting work is information representing contents of the assisting work, such as a name of the work. The information related to the time when the assisting work is to be carried out is information that is used in determining the time when the assisting work is to be carried out, such as a time when material will run short.

(2) The managing apparatus according to the mode (1), wherein the worker determining portion comprises a pre-set-worker-information-dependent determining portion which determines said one worker based on a plurality of sets of pre-set worker information that are pre-set for the workers, respectively.

(3) The managing apparatus according to the mode (2), wherein the pre-set-worker-information-dependent determining portion determines said one worker based on the sets of pre-set worker information each set of which comprises at least one of a worker skill level and a responsibility section of a corresponding one of the workers.

The pre-set worker information is, e.g., a worker skill level, a responsibility section, and/or a job family of each of the workers. Above all, if a responsible worker to carry out each assisting work is determined based on the worker skill level, the each assisting work can be assigned to a worker who has an appropriate skill level corresponding to a technical level of the each assisting work. For example, an assisting work having a high technical level that cannot be carried out by an ordinary worker is assigned to a worker who has a high skill level. The responsibility section of each worker is, for example, a work place where one or more assisting works are carried out by the each worker; a sort or sorts of one or more assisting works that are carried out by the each worker; a sort or sorts of one or more substrate-related-operation performing machines; or one or more groups of substrate-related-operation performing machine(s). For example, in the case where the responsibility section of each worker is a considerably narrow work area in which the each worker need not move long distances, useless movements of the workers can be reduced because responsible workers are determined based on the respective responsibility sections of the workers. A group of substrate-related-operation performing machine(s) may be one including at least one substrate-related-operation performing machine, or one including at least one substrate-related-operation performing line.

(4) The managing apparatus according to any of the modes (1) through (3), further comprising a current-worker-information obtaining portion which obtains a plurality of sets of current worker information representing respective current states of the workers,
wherein the worker determining portion comprises a current-worker-information-dependent determining portion which determines said one worker based on the obtained sets of current worker information.

(5) The managing apparatus according to the mode (4), wherein the current-worker-information-dependent determining portion determines said one worker based on the sets of current worker information each set of which comprises at least one of a working state, a position around the substrate-related-operation performing system, an amount of work, and an assignment state of a corresponding one of the workers.

The current worker information is information representing a state of each worker that is related to carrying-out of assisting work(s), and changes as the each worker carries out one or more assisting works. The current worker information comprises information related to at least one of a working state, a position, an amount of work, and an assignment state of each worker that can be recognized, predicted, or scheduled at the current time. The information related to the working state represents whether each worker is carrying out an assisting work, how long each worker has been carrying out an assisting work, or how long each worker has been waiting without carrying out an assisting work. Based on the information related to the working state, a worker who is waiting can be selected as a responsible worker to carry out an assisting work. The information related to the position represents a position where each worker is present, for example, a current position of each worker, or a position of each worker after the each worker has carried out an assisting work. Based on the information related to the position, a worker who is present at a position near to a place where an assisting work is to be carried out, can be selected as a responsible worker. In this case, an amount of movement of each worker can be reduced. The information related to the assignment state represents how assisting works have been assigned to the respective workers, for example, what sort of assisting works have been assigned to the workers, or what times the assigned assisting works are carried out. The information related to the time when each assigned assisting work is carried out represents a time when each assigned assisting work is to be started, or a time when each assigned assisting work is to be finished. The information related to the amount of work represents a load applied to each worker in the past and/or the future, for example, a total time duration, or a total number of assisting works, in which each worker has been engaged within a pre-set time before the current time, and/or a total number of assisting works that are currently assigned to each worker or a total time duration needed to carry out those assigned assisting works. Based on the information related to the amount of work, a worker whose amount of work is small can be selected as a responsible worker. In this case, therefore, respective amounts of work of all the workers can be made as equal as possible to each other.

(6) The managing apparatus according to any of the modes (1) through (5), wherein the worker determining portion comprises a worker-intention-dependent determining portion which determines said one worker based on an intention of said one worker.

(7) The managing apparatus according to the mode (6), wherein the worker-intention-dependent determining portion comprises
   a pending-work-related informing portion which informs each of at least one of the workers of said at least one objective work which has not been assigned, and
   a worker-intention-information obtaining portion which obtains, from at least one of the at least one informed worker, at least one set of worker intention information representing the intention of said at least one worker about whether said at least one worker carries out said at least one objective work.

(8) The managing apparatus according to the mode (7), wherein the worker-intention-dependent determining portion further comprises a candidate selecting portion which selects, from the workers, at least one candidate who can carry out said at least one objective work, and
   wherein the pending-work-related informing portion informs each of said at least one candidate selected by the candidate selecting portion, of said at least one objective work.

A worker is informed of an assisting work which has not been assigned, and worker intention information representing an intention of the worker about whether the worker carries out the assisting work is obtained. In this case, based on the obtained worker intention information, a responsible worker can be determined. The informing portion may employ an informing means that informs a worker of an assisting work, for example, a wire or wireless terminal device (i.e., a computer), or a display device or a speaker that is employed by each substrate-related-operation performing machine or the substrate-related-operation performing system. The intention of each worker may be inputted, as worker input information (e.g., worker intention information), into an input device that is employed by the system and is operable by each worker, and may be obtained as the worker input information. The input device may be a wire or wireless terminal device, or an input means that is employed by, e.g., each substrate-related-operation performing machine. An assignment of an assisting work may be done by determining a responsible worker to carry out the assisting work independent of an intention of the worker. However, if the intention of the worker is confirmed, then the assisting work can be more reliably assigned to the responsible worker. For example, if a worker cannot carry out, for some reason, an assisting work (e.g., the worker is now carry out another assisting work), then the worker inputs information indicating that the worker cannot carry out the work. In this case, the assisting work can be assigned to another worker. If a plurality of workers are informed of an assisting work, then each of the workers inputs information indicating whether the each worker can carry out the work. Thus, the assisting work can be reliably assigned to a worker who can carry out the work. Moreover, in the case where a candidate who is an appropriate worker to carry out an assisting work is selected from a plurality of workers, useless communications or responses can be reduced. The above-described candidate selecting portion may select the candidate by utilizing one or more of the respective technical features recited in the modes (2) through (5). For example, the candidate selecting portion may select the candidate based on at least one of the pre-set worker information and the current worker information.

(9) The managing apparatus according to any of the modes (1) through (8), wherein the worker determining portion determines said one worker at a time determined based on a time when said at least one objective work is carried out.

The time determined based on the time when the assisting work is carried out is, for example, a time a little bits (e.g., several minutes or ten and several minutes) before the time of carrying-out of assisting work. If the responsible worker is determined at the time a little bits before the time of carrying-out of assisting work, then the worker can efficiently carry out the work.

(10) The managing apparatus according to any of the modes (1) through (9), wherein the assisting-work occurrence information obtaining portion obtains a plurality of sets of said assisting-work occurrence information which are related to a plurality of assisting works, respectively,
   wherein the worker determining portion determines, in an order of priority of the assisting works, the workers who carry out the assisting works, respectively.

In the case where a plurality of sets of assisting-work occurrence information respectively related to a plurality of assisting works are obtained, workers to carry out the assisting works are determined in the order of priority of the works. In this case, the assisting works can be carried out efficiently. Respective degrees of priority of the assisting works may be determined based on respective times when the works are carried out. For example, an assisting work to be carried out at a time nearer to the present time is determined to have a higher degree of priority. Alternatively, the respective degrees of priority of the assisting works may be determined based on respective degrees of importance of the works. A degree of importance of each assisting work may be pre-set based on, e.g., a magnitude of influence caused when the each work is not carried out, or a proportion of the workers who can carry out the each work. For example, a degree of importance of a recovering work may be pre-set to be a considerably high; and a degree of importance of a recovering work to recover a failure resulting in producing defective products at a higher rate, or a failure resulting in decreasing an operation speed to a lower speed, may be pre-set to be higher. Since an assisting work having a higher degree of importance is assigned, with a higher degree of priority, to a worker, the assisting work having the higher importance can be carried out more reliably. For example, if a responsible worker to carry out an important assisting work that has a high degree of difficulty and can be carried out by only a special worker, is determined at an earlier time, i.e., the special worker is determined as the responsible worker at the earlier time, then another assisting work that is not so important and can be carried out by an ordinary worker can be prevented from being assigned to the special worker at a time when the important work is carried out.

(11) The managing apparatus according to any of the modes (1) through (10), wherein the assisting-work occurrence information obtaining portion obtains a plurality of sets of said assisting-work occurrence information which are related to a plurality of assisting works, respectively, wherein the worker determining portion comprises a related-work-related determining portion which determines, as a plurality of said objective works, a plurality of related works which are related to each other on carrying-out of the works, and determines said one worker who carries out the related works.

The related works are related to each other with respect to, for example, at least one of respective sorts of the works, respective objects of the works, respective places where the works are carried out, and respective times when the works are carried out. For example, a plurality of assisting works that are of a same sort, a plurality of assisting works whose respective objects are respective substrate-related-operation performing machines of a same sort, or a plurality of assisting works that are carried out at respective places near to each other can be assigned to a single worker. The related works related to each other with respect to the times when the works are carried out are, for example, a plurality of assisting works that are carried out at respective times continuous with each other, more specifically described, a plurality of continuous assisting works that can be continuously carried out by a single worker. It is preferred that the continuous assisting works be carried out by the single worker while respective time durations in which the corresponding substrate-related-operation performing machines are stopped are not increased so much. To this end, it is preferred that the respective times when the continuous assisting works are carried out differ from each other by an appropriate time (for example, a time needed to carry out one of the works).

(12) The managing apparatus according to any of the modes (1) through (11), wherein the assisting-work occurrence information obtaining portion obtains a plurality of sets of said assisting-work occurrence information which are related to a plurality of assisting works, respectively, wherein the worker determining portion comprises a simultaneous-work-related determining portion which determines, as a plurality of said objective works, a plurality of simultaneous works which are preferred to be carried out simultaneously with each other, and determines the workers who carry out the simultaneous works, respectively.

For example, when an operation of a substrate-related-operation performing machine is stopped for a worker to carry out an assisting work thereon, there may be another assisting work that needs to stop the operation of the machine. In this case, if the latter assisting work is simultaneously carried out by another worker, a time duration in which the operation of the machine is stopped can be reduced as compared with the case where the two assisting works are carried out at different times.

(13) The managing apparatus according to any of the modes (1) through (12), further comprising an assigned-work-related informing portion which informs said one worker determined by the worker determining portion, of said at least one objective work assigned to said one worker.

Since the assisting-work managing apparatus comprises the assigned-work-related informing portion that informs the determined worker of the assisting work assigned to the worker, the worker can easily recognize that the assisting work has been assigned to himself or herself. The informing portion may employ an informing means as described above.

(14) The managing apparatus according to any of the modes (1) through (13), further comprising a plurality of portable terminal devices which can be carried by the workers, respectively, wherein the managing apparatus sends, and receives, information to, and from, the portable terminal devices carried by the workers.

Since the workers carry the respective portable terminal devices, the workers can receive respective sets of information through the portable terminal devices, or can input the respective intentions as respective sets of worker input information into the portable terminal devices, irrespective of where the workers may be working. Each of the portable terminal devices may be a portable computer that may optionally have a wireless communication function, such as a PDA (personal digital assistant). Alternatively, each portable terminal device may be a portable telephone that can be connected to the Internet.

(15) A managing program for being implemented by a computer to manage an assisting work to assist a substrate-related-operation performing system comprising a plurality of substrate-related-operation performing machines each of which performs a substrate-related operation that is related to a circuit substrate, the assisting work being carried out, as needed, when the substrate-related-operation performing system is operated, the managing program assigning, each time a need to carry out the assisting work occurs, the assisting work to one of a plurality of workers, the managing program being characterized by comprising an assisting-work occurrence information obtaining step of obtaining assisting-work occurrence information which is related to occurrence of a need to carry out at least one assisting work; and a worker determining step of determining one of the workers who is to carry out said at least one assisting work as at least one objective work, so that said at least one objective work is assigned to said one worker.

(16) A recording medium on which the managing program according to the mode (15) is recorded to be readable by a computer.

The mode (15) and the mode (16) relate to a managing program for managing an assisting work to assist a substrate-related-operation performing system, and a recording medium on the managing program is recorded, respectively. The foregoing description related to the assisting-work managing apparatus also applies to each of the managing program and the recording medium, and accordingly it is not repeated here for preventing redundancy of the description. Each of the mode (15) and the mode (16) relating to the managing program and the recording medium, respectively, can be combined with an arbitrary one of the above-described modes (2) through (14).

BRIEF DESCRIPTION OF THE DRAWINGS

FIG. 1 is an illustrative view of a general construction of a substrate-related-operation performing system to which the present invention is applied.

FIG. 2 is a view showing an assisting-work master file.

FIG. 3 is a view showing a portion of a worker master file.

FIG. 4 is a view showing a portion of a current worker information.

FIG. 5 is a view showing a portion of a supplying work list.

FIG. 6 is a view showing a portion of a recovering work list.

FIG. 12 is a view showing a portion of the current worker information at a time different from the time corresponding to the current worker information shown in FIG. 4.

FIG. 14 is a view showing the recovering work list at a time different from a time corresponding to the recovering work list shown in FIG. 6.

FIG. 15 is a view showing a current worker information file corresponding to an example different from the example corresponding to the current worker information file shown in FIGS. 4 and 12.

FIG. 16 is a view showing a current worker information file corresponding to the example and a time different from the example and the times corresponding to the current worker information files shown in FIGS. 4 and 12.

BEST MODE FOR CARRYING OUT THE INVENTION

Figure 7:
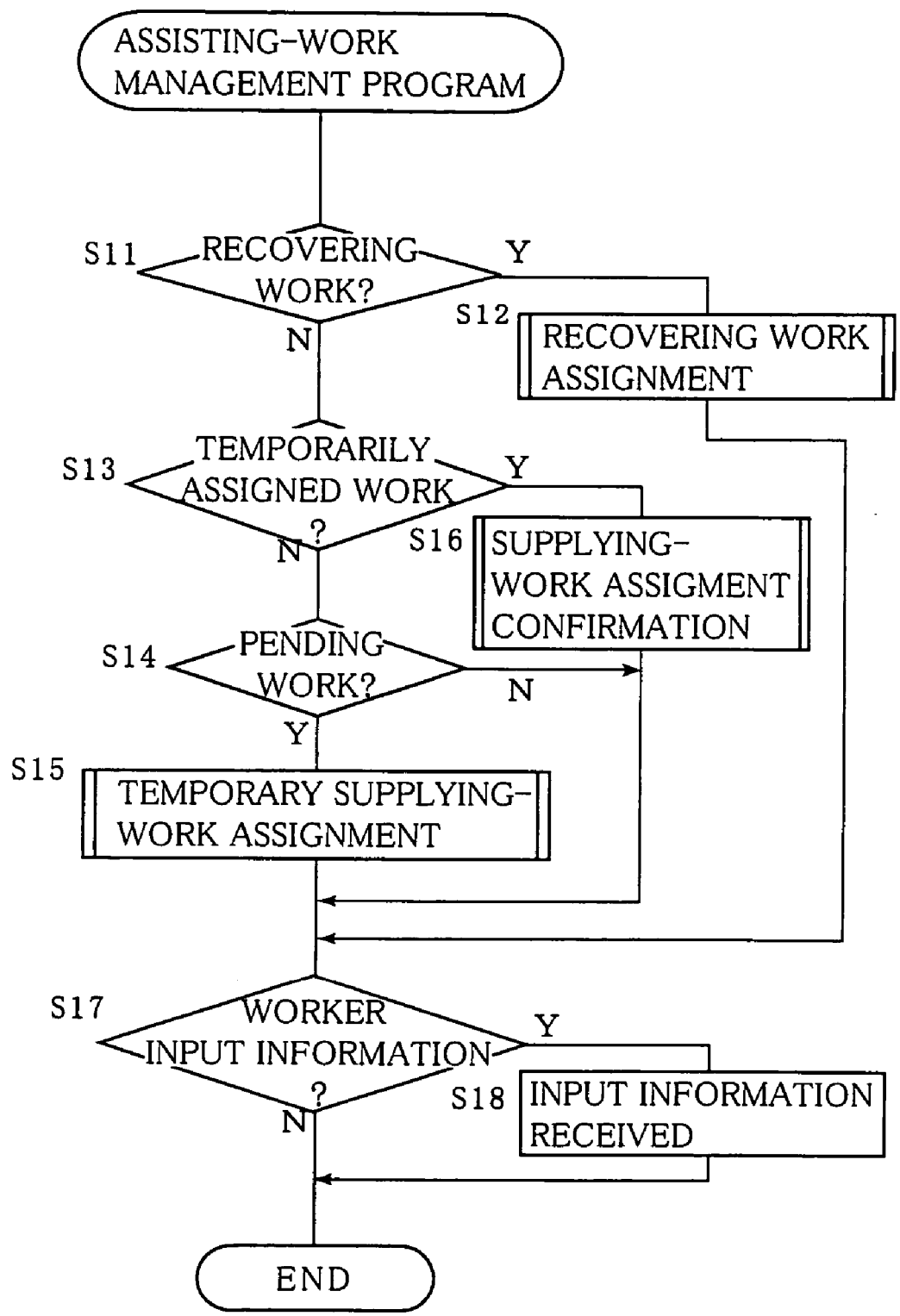
FIG. 7 is a flow chart representing an assisting-work management program as an embodiment of the present invention.

Hereinafter, there will be described in detail an embodiment of the present invention. It is, however, to be understood that the present invention is by no means limited to the details of the following embodiments but may be embodied with various changes, such as those described in DISCLO-SURE OF THE INVENTION, that may occur to a person skilled in the art.

1. Substrate-Related-Operation Performing System 1.1 General Construction of Substrate-Related-Operation Performing System FIG. 1 is an illustrative view of a portion of a substrate-related-operation performing system. The present substrate-related-operation performing system includes a plurality of substrate-related-operation performing groups. In the present embodiment, each of the substrate-related-operation performing groups is provided by a machine line that is constituted by a plurality of substrate-related-operation performing machines arranged in an array. The present substrate-related-operation performing system includes various sorts of substrate-related-operation performing groups that are obtained by combining various sorts of substrate-related-operation performing machines with each other in various manners. However, FIG. 1 shows three substrate-related-operation performing groups 12A, B, C each of which is obtained by combining a screen-printing machine 10PR as a solder printing machine, a dispenser 10DI as an adhesive applying machine, a high-speed component-mounting machine 10RO as a rotary-head-type component-mounting machine, a general-purpose component-mounting machine 10XY as a component-mounting machine that is constituted by connecting a plurality of XY-robot-type component-mounting modules to each other, and a reflow furnace 10FU as a soldering heater furnace, with each other. (Hereinafter, the substrate-related-operation performing groups 12A, B, C will be generally referred to as the "substrate-related-operation performing groups 12", where appropriate; and the substrate-related-operation performing machines employed by the substrate-related-operation performing groups 12A, B, C will be generally referred to as the "substrate-related-operation performing machines 10", where appropriate.) Each of the substrate-related-operation performing machines 10 includes a control panel, and is controlled by the control panel so as to perform a substrate-related operation. Each of the control panels includes a display device and an input device, and is operable by a worker.

The respective control panels of the substrate-related-operation performing machines 10 are connected to a LAN (local area network) 30 as an information communication line employed by the substrate-related-operation performing system. To the LAN 30, a machine management device 32 and an assisting-work management device 36 are connected. Each of the substrate-related-operation performing machines 10, the machine management device 32, and the assisting-work management device 36 includes a communication unit, such as a LAN board, and can communicate information with each other via the LAN 30. The machine management device 32 receives various sorts of information sent from the respective control panels of the substrate-related-operation performing machines 10, and sends, based on the received information, respective commands to the same 10, or processes the received information, as needed. For example, when one of the substrate-related-operation performing machines 10 has failed, the machine management device 32 adjusts the respective operations of the other substrate-related-operation performing machines 10 belonging to the same substrate-related-operation performing group 12 as the group 12 to which the one machine 10 belongs. In addition, the machine management device 32 estimates, based on information sent from an appropriate substrate-related-operation performing machine 10, a time when the material that is consumed in the machine 10 will run short.

A wireless communication device 40 is connected to the LAN 30, and each of a plurality of workers carries a PDA (personal digital assistant) 42 as a portable terminal device that has a wireless communication function. Thus, each of the PDAs 42 and the machine management device 32 can communicate information with each other via the wireless communication device 40 and the LAN 30. Each of the PDAs 42 has a registered worker number (described later) that identifies a corresponding one of the workers who carries the each PDA 42, so that when the machine management device 32 receives information from the each PDA 42, the device 32 can identify, based on the registered worker number added to the received information, the worker who carries the each PDA 42. Each of the PDAs 42 includes a touch panel and a speaker, and can visibly or audibly inform the worker of, e.g., assisting-work information sent from the assisting-work management device 36 and send, e.g., information inputted by the worker, to the device 36. In the case where a microphone is connected to each of the PDAs 42 that can do speech-recognition communication and can implement speech-communication software, the corresponding worker can use his or her voices to communicate various sorts of information with the other workers, or input various sorts of information into the each PDA 42.

The assisting-work management device 36 is essentially constituted by a computer including a CPU, a ROM, a RAM, and an input-and-output interface all of which are not shown, and includes an input device such as a keyboard; a display device such as a cathode ray tube; and an external memory device such as a hard disc. The ROM, the RAM, and the external memory device cooperate with each other to store an assisting-work management program, described later, and various sorts of information. Hereinafter, the ROM, the RAM, and the external memory device will be generally referred to as the "memory device".

2. Assisting Work 2.1 Assisting Work

In the present embodiment, the assisting-work management device 36 manages material supplying works and recovering works each as an assisting work. The memory device of the assisting-work management device 36 stores, as an assisting-work master file, basic assisting-work information as basic information common to various sorts of assisting works that are managed by the device 36. FIG. 2 shows the basic assisting-work information recorded as the assisting-work master file. The basic assisting-work information includes respective names of the assisting works; respective sorts of the assisting works; respective objective machines of the assisting works; stopping (YES) or non-stopping (NO) of the objective machine of each of the assisting works; respective needed skill levels of the assisting works; respective standard needed times of the assisting works; respective arrival-time adjusting times of the assisting works; respective priority adjusting times of the assisting works; and respective material taking times of the assisting works. The "stopping or non-stopping of the objective machine of each of the assisting works" is information indicating whether stopping of the operation of the substrate-related-operation performing machine 10 as the objective machine of the each assisting work is needed when the each assisting work is carried out. More specifically described, each of the assisting works indicated by "YES" is carried out only under a condition that the performing machine 10 as the objective machine of the each assisting work is not performing the substrate-related operation; and each of the assisting works indicated by "NO" can be carried out under a condition that the performing machine 10 as the objective machine of the each assisting work is performing the substrate-related operation. The "respective needed skill levels of the assisting works" are, in short, respective degrees of difficulty of the assisting works. Each of the assisting works indicated by "H (high)" is carried out by only one of the workers who are skilled in carrying out the each assisting work; and each of the assisting works indicated by "L (low)" can be carried out by any of the workers. The "respective standard needed times of the assisting works" are respective typical times needed to carry out the assisting works, and include, as needed, respective margin times to arrive, in advance, at respective work places and prepare for the current assisting works, and/or respective margin times to prepare for the respective next assisting works. The "respective arrival-time adjusting times of the assisting works" are respective times used to adjust, based on respective material-shortage times (described later) of the assisting works, respective recommended arrival times of the assisting works. The "respective priority adjusting times of the assisting works" are respective times used to adjust, based on the respective recommended arrival times of the assisting works, respective priority-order times of the assisting works (described later). The respective standard needed times of the assisting works and the respective arrival-time adjusting times of the assisting works will be described later. The "respective material taking times of the assisting works" are respective times needed to fetch, e.g., new reels or feeders from respective electronic-component storage places 46A, B, C corresponding to the three substrate-related-operation performing groups 12A, B, C.

2.2 Material Supplying Works

The material supplying works each as a sort of assisting work are works to supply various sorts of materials to the substrate-related-operation performing machines 10. The basic assisting-work basic information include basic information for the material supplying works such as a solder supplying work, a syringe replacing work, feeder replacing works (RO and XY), and a reel replacing work. The "solder supplying work" is a work to supply new solder cream stored in the vicinity of each screen-printing machine 10PR, to a solder-cream container of the each screen-printing machine 10PR. The "syringe replacing work" is a work to replace an adhesive injection syringe of each dispenser 10DI, with a new one stored in the vicinity of the each dispenser 10DI. Each of the solder supplying work and the syringe replacing work is carried out under the condition that the operation of a corresponding one of the screen-printing machine 10PR and the dispenser 10DI is stopped. Each of the "feeder replacing work RO" and the "feeder replacing work XY" is a work to replace one of a plurality of tape feeders (hereinafter, simply referred to as the "feeders") which are employed by each high-speed component mounting machine 10RO or each general-purpose component mounting machine 10XY (hereinafter, referred to as "each component mounting machine 10RO, XY", where appropriate) and each of which holds a reel around which an electronic-component carrier tape is wound and feeds electronic components carried by the carrier tape. New feeders are stored in the respective electronic-component storage places 46A, B, C for the three substrate-related-operation performing groups 12A, B, C. A worker moves to one of the three electronic-component storage places 46 that corresponds to the substrate-related-operation performing group 12 to which the objective machine 10 of the current feeder replacing work belongs, selects a new feeder holding the same sort of electronic-component carrier tape as the sort of the electronic-component carrier tape used up by the current feeder, conveys the selected new feeder to the component mounting machine 10RO, XY as the objective machine 10, and replaces the current feeder with the new feeder. The feeder replacing work XY is carried out under the condition that the operation of the general-purpose component mounting machine 10XY is stopped; but the feeder replacing work RO can be carried out under the condition that the operation of the high-speed component mounting machine 10RO is not stopped. The high-speed component mounting machine 10RO employs two movable feeder tables each of which holds a plurality of feeders. Therefore, when one of the two feeder tables is used to supply electronic components, a worker can replace one or more of the feeders held by the other feeder table in rest. The "reel replacing work" is a work to replace one of the respective reels held by the feeders of each general-purpose component mounting machine 10XY. Like the above-described feeder replacing work, a worker moves to an appropriate one of the electronic-component storage places 46, selects an appropriate new reel, conveys the selected new reel to the general-purpose component mounting machine 10XY, and replaces the current reel with the new reel. The reel replacing work includes a splicing operation to connect a trailing end portion of the electronic-component carrier tape held by the current reel, to a leading end portion of the electronic-component carrier tape held by the new reel.

2.3 Recovering Works

The recovering works each as another sort of assisting work are works to remove respective causes of respective failures occurring to the substrate-related-operation performing machines 10, and thereby restore the devices 10 to their normal conditions. The basic assisting-work information includes basic information for the recovering works such as a nozzle replacing work, an image-recognition-condition adjusting work, a solder-amount adjusting work, and a heating-condition adjusting work. The "nozzle replacing work" is a work to replace, with a new suction nozzle, one of a plurality of suction nozzles employed by each component mounting machine 10RO, XY, said one suction nozzle being unable to function normally because of, e.g., wearing, deformation, or breaking. When the nozzle replacing work is carried out, the operation of the component mounting machine 10RO, XY is stopped. The "image-recognition-condition adjusting work" is a work to adjust an image recognition condition. Each component mounting machine 10RO, XY includes an image taking camera to take an image of an electronic component sucked and held by each of the suction nozzles, and processes image data representing the taken image of the electronic component so as to determine, e.g., a position of the component held by the each nozzle. However, if electronic components of a different production lot requiring a different image recognition condition than the current image recognition condition are supplied to the component mounting machine 10RO, XY, then those components may not be accurately recognized by the machine 10RO, XY, and accordingly the operation of the machine 10RO, XY may be automatically stopped because it is judged that an image-recognition error has occurred. In this case, the image-recognition-condition adjusting work is carried out. The "solder-amount adjusting work" is a work to adjust an amount of cream solder that is printed by each screen-printing machine 10PR. The "heating-condition adjusting work" is a work to adjust a heating condition under which a printed wiring board on which electronic components have been mounted is heated by each reflow furnace 10FU.

3. Information Related to Workers 3.1 Pre-Set Worker Information

In the present substrate-related-operation performing system, the assisting works related to the three substrate-related-operation performing groups 12A, B, C are carried out by five workers W1 through W5 (FIG. 1). Pre-set worker information as basic information for the workers W1 through W5 is stored as a worker master file by the memory device of the assisting-work management device 36, and is utilized in assigning the assisting works to the workers. FIG. 3 shows a portion of the pre-set worker information recorded as the worker master file. The "worker No." is an identification code pre-set for each of the workers. The "worker skill level" in FIG. 3 corresponds to the needed skill level of each of the assisting works as a portion of the above-described basic assisting-work information (FIG. 2), and each of the skilled workers (i.e., W1, W2) indicated by "H" can carry out all the assisting works the respective skill levels of which are "H" or "L" and each of the ordinary workers (i.e., W3 through W5) indicated by "L" can carry out the assisting works the respective needed skill levels of which are "L" but cannot carry out the assisting works the respective needed skill levels of which are "H". The "responsibility section" is a section for which each worker has responsibility to carry out the assisting works. As described above, the present substrate-related-operation performing system includes the plurality of substrate-related-operation performing groups, and the three performing groups 12A, B, C out of the plurality of performing groups constitute one responsibility section 50. The workers W1 through W5 are engaged in the assisting works related to the three groups 12A, B, C. The skilled workers (W1, W2) have an additional responsibility to carry out, e.g., maintenance works that are not managed by the assisting-work management device 36 in the present embodiment.

3.2 Current Worker Information

Current worker information is information representing respective current states of the workers about how the workers are carrying out the assisting works. Unlike the above-described pre-set worker information, the current worker information is updated as the workers sequentially carry out the assisting works. The current worker information is stored as a current worker information file by the memory device of the assisting-work management device 36, and is utilized together with the pre-set worker information, when the assisting works are assigned to the workers. FIG. 4 shows the current worker information corresponding to the five workers (W1 through W5). In the present embodiment, the current worker information includes respective working states of the workers; respective current positions of the workers; respective assigned works of the workers; respective scheduled starting times of the assigned works; respective scheduled finishing times of the assigned works; respective work finishing positions of the workers; respective intentions of the workers; respective total times of respective actual works of the workers; and respective finishing times of respective previous works of the workers. The "respective working states of the workers" are information indicating whether each of the workers is working or not, and are a sort of working state information. The respective working states of the workers are updated based on, e.g., sets of worker input information as sets of information inputted by the workers into the respective portable terminal devices 42 or the substrate-related-operation performing machines 10. The "respective current positions of the workers" are information obtained by estimation based on the sets of worker input information. For example, when a worker moves to carry out a work other than an assigned work, the worker inputs a destination of the movement into the corresponding portable terminal device 42, so that the worker's current position is updated. For example, if, when the worker W3 starts the syringe replacing work on the dispenser 10DI belonging to the substrate-related-operation performing group 12A, the worker W3 inputs his own worker No. and a command into the input device of the dispenser 10DI, then the dispenser 10DI sends, to the assisting-work management device 36, a set of worker input information including the inputted worker No. and command. Likewise, if, when the syringe replacing work is finished, the worker W3 inputs a command to resume the operation of the dispenser 10DI, then the dispenser 10DI sends, to the assisting-work management device 36, a set of worker input information including the inputted command with the worker number. Based on those sets of worker input information, the assisting-work management device 36 can recognize that the worker W3 has started or finished the syringe replacing work and that the current position of the worker W3 is near to the dispenser 10DI. In the present embodiment, it is assumed that the current position of each worker WI through W5 is recognized as an appropriate one of three areas A, B, C shown in FIG. 1. For example, when the current position of the worker W3 is near to the dispenser 10DI belonging to the group 12A, the current position of the worker W3 is recognized as the area A, and the current worker information is updated based on this recognition.

The "respective assigned works of the workers" are respective work IDs identifying respective assisting works that are assigned to the respective workers W1 through W5 by an assisting-work assigning operation that will be described later. The work IDs will also be described later. The "respective scheduled starting times of the assigned works" are respective scheduled starting times of the assigned works that are to be firstly carried out by the workers W1 through W5, respectively. The "respective scheduled finishing times of the assigned works" are respective scheduled finishing times of the assigned works that are to be last carried out by the workers W1 through W5, respectively. An operation of calculating the scheduled starting and finishing times of each of the supplying works and the recovering works will be described later. The respective scheduled starting times of the assigned works and the respective scheduled finishing times of the assigned works are a sort of assignment state as information related to the assisting work(s) assigned to each worker W1 through W5 (i.e., the respective assignment states of the workers W1 through W5 are a portion of the current worker information). The respective scheduled starting times of the assigned works and the respective scheduled finishing times of the assigned works are utilized in the assisting-work assigning operation, described later, so that new assisting works may be assigned to respective time durations prior to the respective scheduled starting times, or respective time durations subsequent to the respective scheduled finishing times. The "respective work finishing positions of the workers" are respective positions of the workers W1 through W5 when the assigned works that are last carried out by the workers, respectively, are finished. In the case where there are no assisting works assigned to each worker, the position of the each worker when the assigned work is finished is equal to the current position of the each worker. The respective positions when the assigned works are finished and the above-described respective current positions of the workers are a sort of position information. The "respective temporarily assigned works of the workers" are information indicating which of the assisting works has been temporarily assigned to who of the workers W1 through W5, and include respective work IDs identifying respective assisting works temporarily assigned to the workers. The information of "respective intentions of the workers" indicates whether the assisting work temporarily assigned to each worker W1 through W5 has been accepted by the each worker. The "respective total times of respective actual works of the workers" are respective current total times during which the workers W1 through W5 have actually carried out the assisting works in a day, and are a sort of work-amount information representing a load of the assisting work(s) carried out by each worker in the past or the future. The "respective finishing times of respective previous works of the workers" are respective finishing times of the respective assisting works that have been last carried out by the workers, and are a sort of the assignment state of each worker W1 through W5. In the table shown in FIG. 4, each of the column of "temporarily assigned work" and the column of "intention of worker" is labeled with a parenthesized work ID —(N7)— and a parenthesized answer —(Y)—, since those work IDs and those answers are temporarily recorded but then deleted when a responsible worker as a worker who is responsible for carrying out each assisting work is determined.

4. Information Related to Assisting Works 4.1 Obtaining Assisting-Work Occurrence Information Assisting-work occurrence information is related to occurrence of a need to carry out an assisting work, and is produced by the machine management device 32 based on information supplied from each substrate-related-operation performing machine 10. A set of assisting-work occurrence information includes an object and a sort of an assisting work and a time when the work is to be carried out. The assisting-work management device 36 receives the sets of assisting-work occurrence information from the machine management device 32, and thereby recognizes what sorts of assisting works should be assigned to the workers W1 through W5. More specifically described, the assisting-work management device 36 obtains supplying-work occurrence information as assisting-work occurrence information related to a material supplying work, and recovering-work occurrence information as assisting-work occurrence information related to a recovering work, and manages sets of supplying-work occurrence information and sets of recovering work occurrence information. Although the assisting-work management device 36 manages assisting works related to other responsibility sections than the responsibility section 50 shown in FIG. 1, the following description of the present embodiment addresses only the assisting works related to the responsibility section 50 as a representative section, and the assignment of those assisting works as a representative assignment. Here, it is assumed that the assisting works related to the responsibility section 50 be carried out by the workers W1 through W5 who are responsible for the substrate-related-operation performing groups 12A, B, C, and not carried out by any other workers.

4.2 Supplying-Work Occurrence Information

Supplying-work occurrence information is information related to occurrence of a need to carry out a supplying work, and includes a material shortage time when a material will run short. A material shortage time of each sort of material is determined by the machine management device 32 based on a remaining amount of the each material that is sent from a corresponding substrate-related-operation performing machine 10. Each substrate-related-operation performing machine 10 periodically (e.g., every minute) sends, to the machine management device 32, a remaining amount of the material used by the each machine 10, together with a current time (i.e., a time when the remaining amount is measured). The machine management device 32 stores, as an operation history of the each machine 10, a plurality of sets of data each set of which includes the remaining amount of the material and the current time, and determines, based on a pre-set number of the sets of data, a speed of operation of the each machine 10 and a speed of decreasing of the material. In addition, based on the thus determined speed of decreasing of the material and the last set of data including the last remaining amount of the material and the last current time, the machine management device 32 determines, as a material shortage time, a time when the remaining amount of the material will become equal to a pre-set minimum amount. A set of supplying-work occurrence information includes a material shortage time of a material, a name of a supplying work, and work-object information as information representing that material. The machine management device 32 periodically (e.g., every minute) sends a set of supplying-work occurrence information to the assisting-work management device 36. Each substrate-related-operation performing machine 10 sends the above-described worker input information to the machine management device 32, and the machine management device 32 modifies the material shortage time of each material based on the worker input information.

Recovering-Work Occurrence Information

Recovering-work occurrence information is information related to occurrence of a need to carry out a recovering work, and is sent from the machine management device 32 to the assisting-work management device 36 at the time of occurrence of the recovering work. The machine management device 32 receives, from each substrate-related-operation performing machine 10, information related to a failure thereof recognized by a self-diagnosis function thereof, and produces a set of recovering-work occurrence information. For instance, if a rate at which a suction nozzle of a component mounting machine 10RO, XY fails to suck a component is higher than a reference rate, then the machine 10 judges that the suction nozzle has failed, and sends, to the machine management device 32, information indicating that a failure has occurred, information identifying the nozzle, and information representing the rate at which the nozzle fails to suck components. The machine management device 32 judges, based on the received information, whether a suction-nozzle replacing work should be quickly carried out and sends, to the assisting-work management device 36, a set of recovering-work occurrence information as a command to carry out a nozzle replacing work as a sort of recovering work. The set of recovering-work occurrence information includes work-object information as information identifying a work object (e.g., a suction nozzle), information representing a time when a failure occurred, and urgency-degree information representing whether a recovering work should be quickly carried out.

4.4 Supplying Work List

The assisting-work management device 36 produces, based on the thus obtained sets of supplying-work occurrence information and the above-described basic assisting-work information, a list of supplying works that have occurred, and stores the thus produced list as a supplying work list in the memory device of the device 36. The supplying work list is utilized in the assisting-work assigning operation, described later, in which the supplying works present in the supplying work list are assigned to respective responsible workers, basically in the order of respective degrees of priority of the supplying works. FIG. 5 shows a portion of the supplying work list at a certain time of day. The supplying work list includes information related to work IDs; work-object codes; priority-order times; recommended arrival times; material shortage times; material codes; and near-position continuous works (indicated by "near continuous work" in FIG. 5, and abbreviated to the "near continuous work(s)" in the following description, where appropriate). The "work IDs" are respective identification codes identifying the respective assisting works. The work IDs identifying the assisting works that have been already finished are not used again. Therefore, when new assisting works occur, new work IDs are given to those new works, respectively. Generally, the order of the work IDs does not always coincide with the order of the priority-order times. However, in the supplying work list shown in FIG. 5, it is assumed that the order of the work IDs coincides with the order of the priority-order times, for easier understanding purposes only. The "work-object codes" are codes produced based on the sets of work-object information sent from the machine management device 32, and are information identifying respective places where respective materials as respective objects of the supplying works are held or stored. Each work-object code includes information related to a specific substrate-related-operation performing group 12, a specific sort of a substrate-related-operation performing machine 10, and a specific attachment position in the specific machine 10 that holds or accommodates a corresponding material. For example, regarding a work-object code: A-XY-306, "A" indicates the substrate-related-operation performing group 12A; "XY" indicates the substrate-related-operation performing machine 10XY; "3" out of "306" indicates a mounting module, No. 3, out of a plurality of mounting modules employed by each substrate-related-operation performing machine 10XY; and "06" out of "306" indicates a feeder attachment position, No. 06, out of a plurality of feeder attachment positions on a feeder table employed by each mounting module. In addition, regarding a work-object code: B-RO-205 related to a high-speed component mounting machine 10RO, "2" out of "205" indicates a feeder table, No. 2, out of the two feeder tables employed by each high-speed component mounting machine 10RO; and "05" out of "205" indicates a feeder attachment position, No. 05, out of a plurality of feeder attachment positions on each feeder table.

The "recommended arrival times" are respective times when the workers W1 through W5 are recommended to arrive at respective work places, and are a sort of assignment state of each worker. So long as each worker does not have any special reasons, e.g., a reason that an arrival will be delayed because of the previous assisting work, the each worker must arrive at each work place before the corresponding recommended arrival time, and start the corresponding assisting work. However, in the case where an assisting work is a work, such as a feeder replacing work, that needs to take a new material, the corresponding recommended arrival time will be a time when a worker should arrive at a work place after the worker has taken the new material. A recommended arrival time is calculated by adding an arrival-time adjusting time, shown in FIG. 2, to a material shortage time. An arrival-time adjusting time is a pre-set time that is used to adjust a recommended arrival time. For example, the reel replacing work may be started 120 seconds before a time when an operation of a general-purpose component mounting machine 10XY is stopped, and accordingly an arrival-time adjusting time corresponding to the reel replacing work is pre-set at 120 seconds. Each of the solder supplying work, the syringe replacing work, and the feeder replacing work XY is a supplying work that may not be started before an operation of a corresponding substrate-related-operation performing machine 10 is stopped, and accordingly an arrival-time adjusting time corresponding to each of those supplying works is pre-set at 30 seconds, so as to start the each supplying work immediately after the machine 10 is stopped and thereby minimize a time duration in which the machine 10 is stopped. The "priority-order times" are respective times when the assisting works are carried out, and are a sort of priority degree of each assisting work. An assisting work having an earlier priority-order time has a higher priority degree for its assignment to a worker. In the supplying work list shown in FIG. 5, the supplying works are arranged in the order of the corresponding priority-order times, i.e., from the earliest time to the latest time, and basically those works are assigned in this order to the workers W1 through W5. A priority-order time is obtained by adding a priority-order adjusting time (FIG. 2) to a recommended arrival time. A priority-order adjusting time is a pre-set time to adjust a priority order. For example, regarding each of the solder supplying work, the syringe replacing work, and the feeder replacing work XY, it is desirable to carry out the each work immediately after the operation of the corresponding substrate-related-operation performing machine 10 is stopped by the shortage of the material consumed by the same 10, and a priority-order adjusting time for the each work is pre-set at 30 seconds so as to increase a priority degree of the each work. On the other hand, regarding the feeder replacing work RO, the operation of the corresponding high-speed component mounting machine 10RO is not stopped so soon after the material consumed by the same 10RO runs short, and accordingly it is not needed so much to hurry the feeder replacing work RO. Therefore, a priority-order adjusting time for the feeder replacing work RO is pre-set at 60 seconds so as to decrease a priority degree of the work. Each priority-order adjusting time and/or each arrival-time adjusting time may be changed, as needed, based on a sort, a frequency, and an importance of a corresponding supplying work; a skill level of each worker (e.g., an actual time needed by the each worker to carry out a supplying work), and a total number of the workers.

The "near-position continuous works" are information indicating whether each supplying work has one or more near-position continuous works that are to be carried out at respective positions near to the position where the each supplying work is to be carried out and can be continuously carried out by one worker. For example, in the case where a worker can carry out, after having finished one supplying work in a certain area, one or more other supplying works in the same area, all those supplying works are determined as near-position continuous works. In this case, when the earliest one of the plurality of near-position continuous works is assigned to one worker, the other near-position continuous works are simultaneously assigned to the same worker. Since the worker can continuously carry out the near-position continuous works at the respective positions near to each other, the work efficiency of the worker is improved. For example, in the case where the column of "near continuous work" corresponding to a certain supplying work is indicated by "0" in FIG. 5, the supplying work has no near-position continuous works; and in the case where the column of "near continuous work" corresponding to a certain supplying work is indicated by "1" or "2" in FIG. 5, the supplying work has one or two near-position continuous works that are to be carried out continuously after the supplying work is carried out. In addition, in the case where the column of "near continuous work" corresponding to a certain supplying work is indicated by a work ID in FIG. 5, the supplying work is a near-position continuous work to be carried out following a supplying work having the work ID. This near-position continuous work will be referred to as the "dependent work". In the case where a dependent work is a supplying work, such as the reel replacing work, that needs to take a new material, a worker can take the new material simultaneously when the worker takes a new material for the earliest one of the plurality of near-position continuous works to which the dependent work belongs. In this case, therefore, the worker needs substantially no additional time to take the new material for the dependent work.

The supplying work list, shown in FIG. 5, is updated each time the assisting-work management device 36 receives a set of supplying-work occurrence information. More specifically described, a work-object code as a portion of the received set of supplying-work occurrence information is checked against the respective work-object codes of the supplying works present in the supplying work list and, e.g., a material shortage time for the corresponding supplying work is updated. If the material shortage time is updated in the supplying work list, the priority-order adjusting time and the recommended arrival time corresponding to the supplying work are updated based on the updated material shortage time, and all the supplying works present in the supplying work list are re-arranged in the new order of the respective priority-order times thereof.

4.5 Recovering Work List

The assisting-work management device 36 produces, based on the obtained sets of recovering-work occurrence information and the above-described basic assisting-work information, a list of recovering works that have occurred, and stores the thus produced list as a recovering work list in the memory device of the device 36. Basically, if at least one recovering work is present in the recovering work list, then the assisting-work management device 36 determines at least one worker responsible for the at least one recovering work, in the assisting-work assigning operation, described later. To this end, the assisting-work management device 36 refers to the above-described worker master file and current worker information file. FIG. 6 shows a portion of the recovering work list at a certain time of day. The recovering work list includes information related to work IDs; work-object codes; urgency degrees; occurrence times; standard needed times; replacement-component codes; responsible workers; and simultaneous works. The "work-object codes", used in the recovering work list, are defined in a substantially same manner as the manner in which the work-object codes, used in the above-described supplying work list, are defined. For example, regarding a work-object code: C-XY-4N3, "C-XY" is defined as described above; and "4N3" is defined to indicate a suction nozzle attached to a suction-nozzle attachment position, No. 3, of a plurality of suction-nozzle attachment positions provided in a mounting module, No. 4, of a plurality of mounting modules employed by each general-purpose component mounting machine 10XY. Work-object information as information identifying an object of a recovering work, such as the above-described suction nozzle, includes a work-object code and a replacement-component code, such as a nozzle code identifying the above-described suction nozzle. The "occurrence times" are respective times when recovering works have occurred, and are a sort of assignment state of each worker. The respective "urgent degrees" of recovering works are determined by the machine management device 32 in the following manner:

For example, an urgent degree of a recovering work corresponding to such a failure of a substrate-related-operation performing machine 10 that results in a halt of the device 10 is determined as "H (high)". In addition, in the case where a suction nozzle has failed, if a rate at which component sucking or mounting errors occur is higher than a reference value, then an urgent degree of a nozzle replacing work is determined as "H (high)"; and if the rate is not higher than the reference value, then the urgent degree is determined as "L (low)". Even if a certain suction nozzle may fail, another suction nozzle may be used in place of the former nozzle. In this case, the former nozzle need not be so quickly replaced with a new suction nozzle. The "simultaneous works" are information indicating an assisting work that is, when a recovering work is to be carried out on a substrate-related-operation performing machine 10, to be carried out on the same device 10 simultaneously with the recovering work. In this case, the column of "simultaneous work" corresponding to the recovering work is indicated by a work ID of the assisting work. A simultaneous work is an assisting work that is desired to be carried out simultaneously with a recovering work. For example, if a certain assisting work requires stopping of a substrate-related-operation performing machine 10 on which a recovering work is to be carried out, the recovering work is so determined as to be carried out simultaneously with the assisting work. More specifically described, if a time of occurrence of a nozzle replacing work for a mounting module of a certain general-purpose component mounting machine 10XY and a time when a feeder replacing work XY for the same mounting module is to be carried out are near to each other, a time when the nozzle replacing work is to be carried out is changed to be simultaneous with the time when the feeder replacing work XY is to be carried out, so that the two assisting works may be simultaneously carried out by different workers, respectively. In this manner, a time duration in which the general-purpose component mounting machine 10XY is stopped can be reduced as compared with a manner in which the two assisting works are carried out at different times. Thus, a recovering work accompanied by a simultaneous work is carried out when the simultaneous work is carried out.

5. Assignment of Assisting Works 5.1 Assisting-Work Management Program

The assisting-work management device 36 or the computer thereof implements an assisting-work management program so as to manage assisting works. The above-described supplying work list and recovering work list are updated according to an assisting-work-occurrence-information obtaining routine, not shown, as a portion of the assisting-work management program. FIG. 7 shows a flow chart representing the assisting-work management program. Hereinafter, there will be described an assisting-work assigning operation by reference to the flow chart of FIG. 7. The assisting-work management program is repeatedly implemented in a short time.

First, at Step S11, the computer refers to the above-described recovering work list and judges whether there are any recovering works for each of which a responsible worker has not been determined. If all the substrate-related-operation performing machines 10 are normal, the recovering work list has no recovering works recorded therein and accordingly a negative judgment ("N") is made at Step S11. On the other hand, if a positive judgment ("Y") is made at Step S11, the control of the computer proceeds with Step S12 to assign the recovering work or works to an appropriate worker or workers W1 through W5 in a manner, described later. Since a degree of importance of any recovering work is higher than that of any supplying work, the assisting-work management program is designed to give a higher priority to the assignment of any recovering work than to the assignment of any supplying work.

Then, at Steps S13 through S16, the computer assigns a supplying work. The assignment of supplying work includes a temporary supplying-work assignment routine (Step S15) in which one or more candidates for a responsible worker who carries out the supplying work are selected from the workers W1 through W5, and information related to the supplying work is sent to the selected candidates; and a supplying-work assignment confirmation routine (Step S16) in which each of the candidates who have received the information inputs, as worker intention information, his or her intention about whether he or she will carry out the supplying work, into his or her portable terminal device 42, and the computer conforms, based on the received sets of worker intention information, the assignment of the supplying work. Each of the routines of Steps S15 and S16 is implemented under a pre-set condition.

Figure 8:
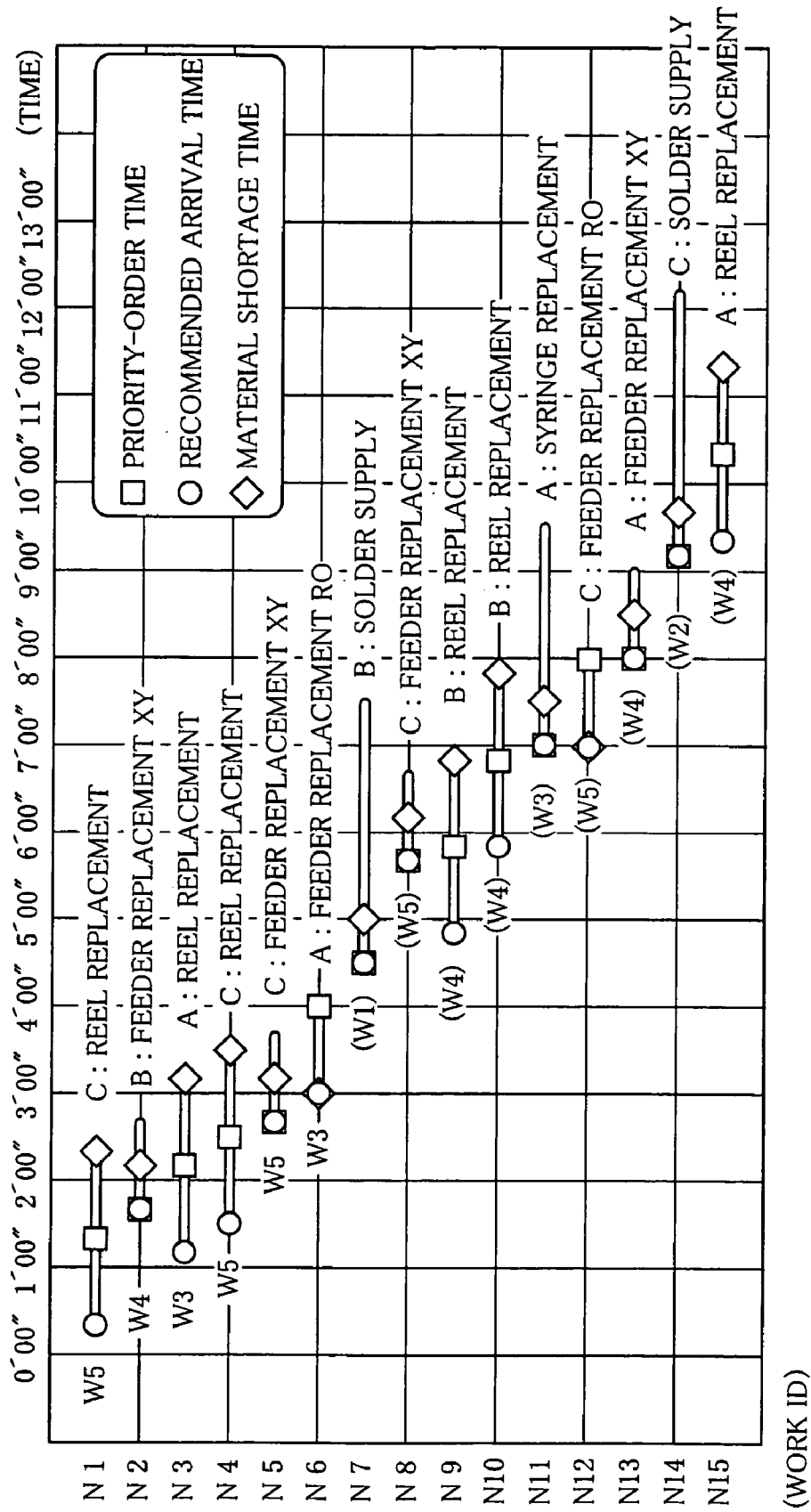
FIG. 8 a graph representing a portion of the supplying work list.

Steps S13 through S16 will be described in detail below, under the following assumptions: First, it is assumed that the supplying work list, shown in FIG. 5, shows that at the time of 14:00:00, respective responsible workers for respective supplying works having respective work IDs, N1 through N6, have been determined (hereinafter, the supplying work having N1 as its work ID will be simply referred to as the "work N1", and this applies to the other supplying works). In addition, though, e.g., a material shortage time shown in the supplying work list may be changed upon reception of a new set of material shortage information, here it is assumed that no portions of the supplying work list are changed in that event for easier understanding purposes only, and it is additionally assumed that no recovering works occur. Moreover, though in the supplying work list, the "respective responsible workers" and the "respective near continuous works" for the works N7 through N15 are indicated by respective parenthesized data, those data have not been recorded at the current time of 14:00:00. If no material shortage times are changed, no recovering works occur, and supplying works are carried out smoothly, then the parenthesized responsible workers and near continuous works are actually determined as time elapses. FIG. 8 shows a graph representing the supplying work list shown in FIG. 5. In the graph, priority-order times are represented by data "□"; recommended arrival times are represented by data "○"; and material shortage times are represented by data "◇", and a priority-order time "□", a recommended arrival time "○" and a material shortage time "◇" corresponding to each supplying work are connected to each other by double lines. However, the double lines do not mean that the responsible worker for the each supplying work is engaged in the supplying work throughout a time duration corresponding to the double lines, or that the worker is not engaged in the supplying work at any times other than that time duration. Here, it is assumed that basically, the responsible worker is engaged in the each supplying work from the recommended arrival time to a scheduled finishing time (described later) of the supplying work. However, in the case where the supplying work needs taking a new material (e.g., the feeder replacing work that is not determined as the dependent work) and/or changing the areas A, B, C, it is assumed that the responsible worker is engaged in the supplying work from a time obtained by subtracting, from the recommended arrival time, the respective times needed to take the new material and move between the two areas. The scheduled finishing time of each supplying work is a time when the each supplying work is predicted to be finished, and is obtained by adding, to the recommended arrival time, a standard needed time for the each supplying work.

On the above-described assumptions, Steps S13 through S16 will be described in detail. At Step S13, the computer judges whether there are any temporarily assigned works, i.e., any supplying works that have been temporarily assigned. More specifically described, the computer checks the current worker information file (FIG. 4) so as to judge whether a work ID is recorded as the "temporarily assigned work" for any workers. If a work ID is recorded as the "temporarily assigned work" for any workers, a positive judgment is made at Step S13, and the control goes to Step S16 (described later); and if no work ID is recorded as the "temporarily assigned work" for any workers, a negative judgment is made at Step S13 and the control goes to Step S14 to judge whether there are any pending works. The pending works mean supplying works for which responsible workers have not been determined and whose priority-order times fall within a pre-set time duration (e.g., 4 minutes) after the current time. More specifically described, the computer selects, from the supplying works recorded in the supplying work list (FIG. 5), one or more pending works such that each of the pending works is a supplying work whose "responsible worker" has no worker No. (here, it is assumed that the parenthesized worker Nos., shown in FIG. 5, have not been recorded yet at the current time of 14:00: 00), and whose "priority-order time" meets the above-described condition. Since the assisting works whose priority-order times fall within the pre-set time duration after the current time are selected as the pending works, responsible workers for those assisting works can be determined at respective times based on the respective times when the assisting works are to be carried out. However, it is possible to determine a time when each assisting work is assigned, based on not its priority-order time but its recommended arrival time or its material shortage time. In the present embodiment, since the time when each assisting work is assigned is determined based on its priority-order time, such an assisting work (e.g., the feeder replacing work XY that cannot be carried out unless the operation of the corresponding substrate-related-operation performing machine 10 is stopped after the material runs short) that has a low degree of freedom with respect to the time when the work is carried out and needs stopping of the operation of the corresponding substrate-related-operation performing machine 10 can be assigned at an early time. For example, the above-described steps are implemented, as follows: At the time of 14:00:00, there is no temporarily assigned work and accordingly a negative judgment is made at Step S13, so that the control goes to Step S14. Since at the time of 14:00:00, there is no pending work and accordingly a negative judgment is made at Step S14. Then, the present program is repeated and, at the time of 14:00:30, the priority-order time of the work N7 falls within 4 minutes after the current time and the work N7 has no responsible worker determined therefor, i.e., it is a pending work. Therefore, a positive judgment is made at Step S14, and the control goes to Step S15. In the following description, times indicated by only minutes and seconds, such as 00'30", are all times past 14:00:00.

5.2 Temporary Supplying-Work Assignment Routine

Figure 9:
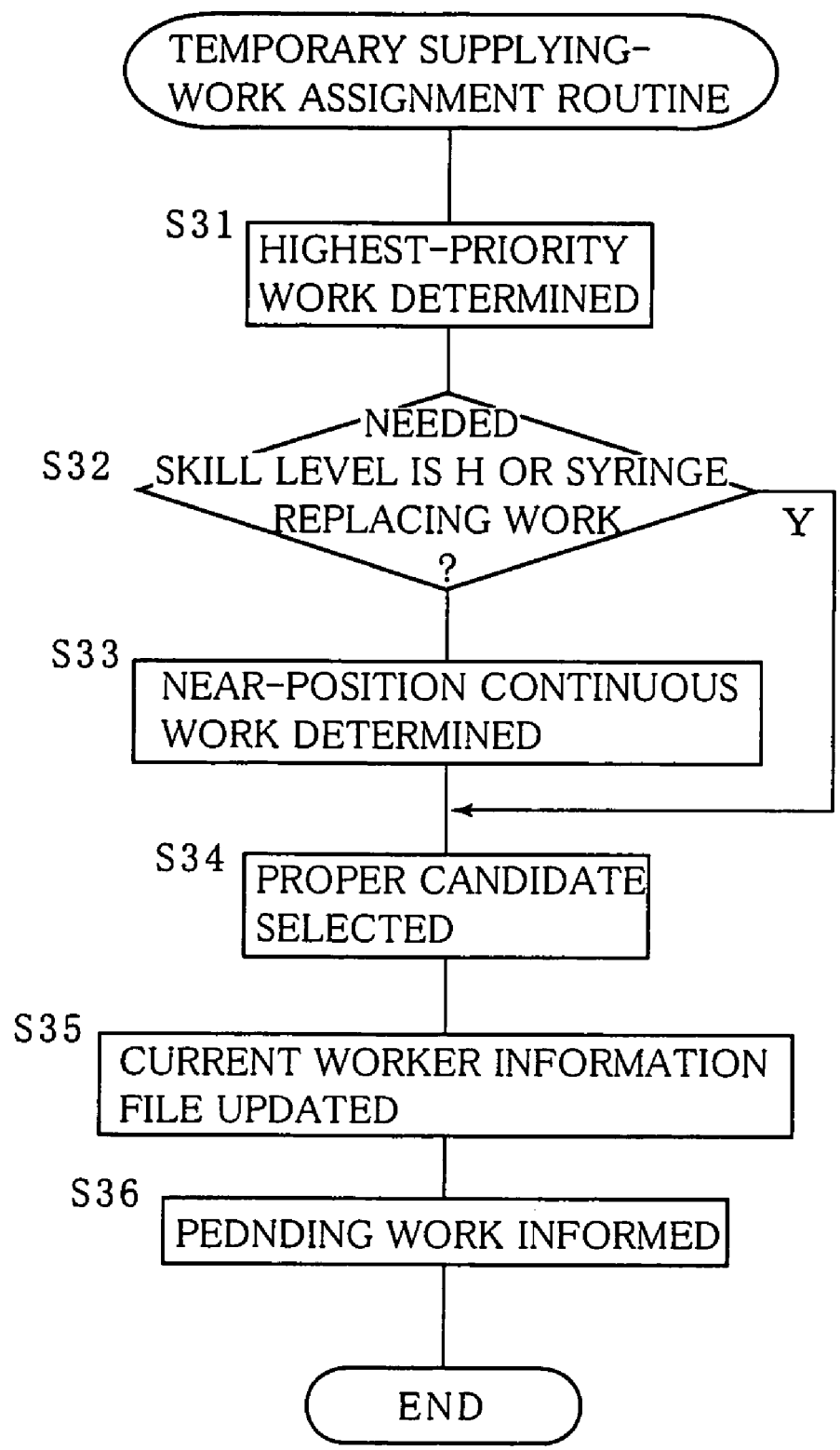
FIG. 9 is a flow chart representing a temporary supplying-work assignment routine as a portion of the assisting-work management program.

FIG. 9 shows a flow chart representing the temporary supplying-work assignment routine at Step S15. First, at Step S31, the computer determines, as an objective work that is an assisting work to be assigned, a highest-priority work that is a supplying work to be assigned with the highest priority. For example, in the case where the supplying work list has only one pending work, the pending work is determined as the highest-priority work; and in the case where the supplying work list has a plurality of pending works, one of the pending works that has the earliest priority-order time is determined as the highest-priority work. In the case where the supplying work list has a plurality of pending works whose priority-order times are equal to each other, one of the pending works that has the earliest recommended arrival time or the earliest material shortage time is determined as the highest-priority work. In the case where the supplying work list has a plurality of pending works whose priority-order times are equal to each other, whose recommended arrival times are equal to each other, and whose material shortage times are equal to each other, one of the pending works that has the smallest work ID is determined as the highest-priority work. For example, at the current time of 00'30", the supplying work list has only one pending work, i.e., the work N7, i.e., the solder supplying work. Therefore, the work N7 is determined as the highest-priority work. At Steps S32 and S33, the computer determines a near continuous work for only the highest-priority work which is other than the syringe replacing work and whose needed skill level is "L". More specifically described, the computer refers to the supplying work list with respect to the "work name" and the "needed skill level" of the highest-priority work (i.e., the work N7), and makes a judgment at Step S32. Since, in the present embodiment, the supplying works whose needed skill levels are "H" are carried out at a considerably low frequency and accordingly are unlikely to be near continuous works, those works are excluded. In addition, since it is preferred that one of the near continuous works that is to be carried out first of all be a supplying work that needs to take a new material such as a reel, the syringe replacing work is not determined as the first one of the near continuous works. Since the "needed skill level" of the work N7 is "H", no near continuous works are not determined for the work. Therefore, in this example, only the work N7 as the highest-priority work is determined as the objective work.

At Step S34, the computer selects, based on the pre-set worker information and the current worker information, one or more candidates for the objective work. First, regarding the selection based on the pre-set worker information, the computer refers to the pre-set worker information file (FIG. 3) with respect to the respective "responsibility sections" and the respective "worker skill levels" of all the workers W1 through W5, and selects, as one or more first candidates, one or more workers the responsibility section of each of which covers the highest-priority work, and then selects, as one or more second candidates, one or more selected first workers the worker skill level of each of which is equal to the needed skill level of the highest-priority work. Subsequently, the computer selects, as one or more third candidates, one or more selected second candidates, based on respective assignment states thereof each as a sort of the current worker information. More specifically described, the computer refers to the current worker information (FIG. 4) with respect to the respective "scheduled finishing times of assigned works" corresponding to the second candidates and, in short, the computer selects, as one or more third candidates, one or more second candidates the scheduled finishing time of each of which is prior to the time when the highest-priority work is to be carried out. Then, the computer selects, as one or more proper candidates, one or more selected third candidates, based on respective position information thereof as another sort of the current worker information. More specifically described, the computer refers to the current worker information with respect to the respective "work finishing positions" of the third candidates and, in short, the computer selects, as one or more proper candidates, one or more third candidates the work finishing position of each of which is sufficiently near to the position where the highest-priority work is to be carried out. More specifically described, the computer selects, as one or more proper candidates, one or more third candidates the work finishing position of each of which belongs to the same area as the area to which the position where the highest-priority work is to be carried out belongs. If there is no third candidate that meets the above-described conditions, then the computer selects, as one or more proper candidates, one or more third candidates the work finishing position of each of which belongs to an area adjacent to the area to which the position where the highest-priority work is to be carried out belongs. If there is no third candidate that meets the latter condition, then the computer selects, as one or more proper candidates, one or more third candidates the work finishing position of each of which belongs to an area that is adjacent to the area adjacent to the area to which the position where the highest-priority work is to be carried out belongs.

One or more proper candidates for the work N7 are selected in the following manner: First, from the objective work code (B-PR-CH) of the work N7, the computer judges that the work N7 is an assisting work related to the substrate-related-operation performing group 12B, and selects, as the first candidates, the workers W1 through W5 the "responsibility section" of each of whom is indicated by "A, B, C" including the area B in the pre-set worker information file (FIG. 4) (though only the workers W1 through W5 are shown in FIG. 3, the present substrate-related-operation performing system is operated by not only the workers W1 through W5 but also other workers, and the assisting-work management device 36 manages assisting works assigned to those other workers). In addition, since the needed skill level of the work N7 is "H" (FIG. 2), the computer selects, as the second candidates, the workers W1, W2 (FIG. 3) the "worker skill level" of each of whom is indicated by "H". Subsequently, the computer refers to the respective "scheduled finishing times of assigned works" corresponding to the second candidates. Since at the current time of 00'30", the workers W1, W2 as the second candidates have no recordings in their respective "scheduled finishing times of assigned works", that is, have no assigned works, the computer judges that both the workers W1, W2 can carry out the objective work, and accordingly determines the two workers W1, W2 as the third candidates. Since, in the present embodiment, the skilled workers W1, W2 are also responsible for, e.g., the maintenance works, only the material supplying works that are carried out at a low frequency and with a high degree of difficulty, and the recovering works are assigned to the skilled workers W1, W2, so that a less amount of work may be assigned to the skilled workers W1, W2 than the amount of work assigned to the ordinary workers W3 through W5. A manner in which the computer operates in the case where at least one of the workers W1, W2 has an assigned work, will be described in connection with an assignment of the work N8, described later. From the "work-object code" of the work N7, the computer recognizes that the position where the work is carried out is the area B. However, the respective "work finishing positions" of the workers W1, W2 as the third candidates are the area A and the area C, respectively, that is, no third candidate is present in the area B. Therefore, the computer selects, as the proper candidates, the two workers W1, W2 the work finishing position of each of which is adjacent to the area B. At Step S35, the computer updates the current worker information, such that the work ID "N7" is recorded in the respective "temporarily assigned works" of the two workers W1, W2. Then, at Step S36, the computer informs each selected proper candidate of the pending work for which a responsible worker has not been determined yet. More specifically described, the computer sends information including a portion of the supplying work list that is related to the highest-priority work, to the respective portable terminal devices 42 of the two workers W1, W2 each via the wireless communication device 40.

5.3 Operation of Portable Terminal Device

Figure 10:
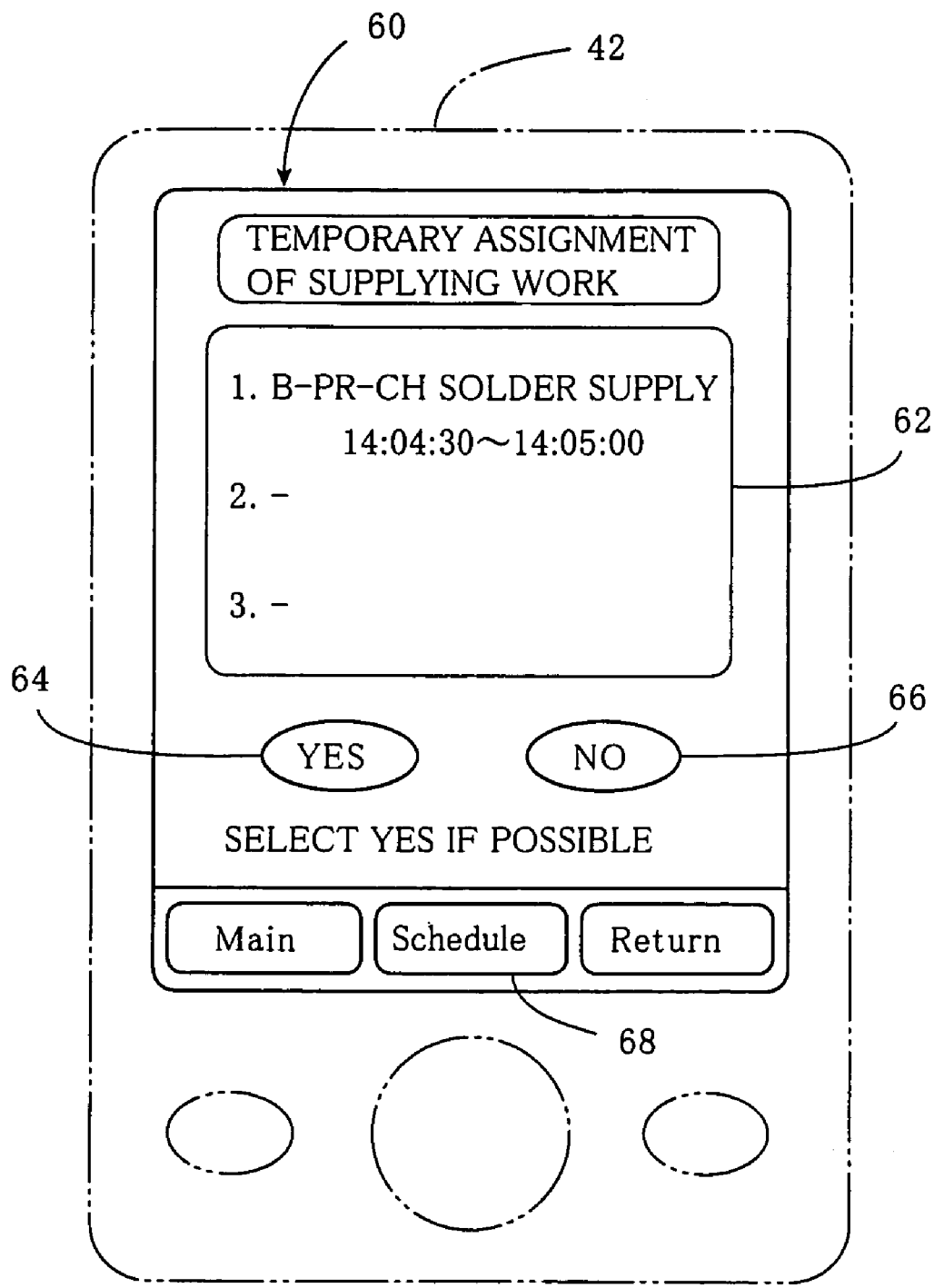
FIG. 10 is a view showing a display screen of a portable terminal device.

Hereinafter, there will be described an operation of the portable terminal device 42 by each worker W1, W2 who is informed of a pending work for which a responsible worker has not been determined yet. The portable terminal device 42 that has received the information indicating the pending work displays, on a display screen 60 thereof, an image representing the received information, and informs, in an audible manner, the each worker of the fact that the terminal device 42 has received the information. FIG. 10 shows the display screen 60 of the portable terminal device 42 carried by each worker W1, W2. More specifically described, the display screen 60 includes a work display portion 62 that displays the information indicating the pending work, i.e., the work-object code, work name, recommended arrival time, and material shortage time of the pending work. In the case where one or more near continuous works have been determined, the one or more continuous works, i.e., one or more supplying works are indicated as the second and third items (2. - and 3. -). However, since regarding the example shown in FIG. 10 no near continuous works have been determined, the second and third items are blank. Each of the workers W1, W2 sees the recommended arrival time and material shortage time of the pending work, and judges whether he or she can carry out the work. If the each worker can carry out the work, then he or she taps a pad "YES" 64 with his or her finger or a pen; and if not, he or she taps a pad "NO" 66 in the same manner. Since both the two workers W1, W2 have no assigned works at that time duration, they may tap the pad "YES" 64. If so, each of the two portable terminal devices 42 sends, to the assisting-work management device 36 via the wireless communication device 40 connected to the LAN 30, a set of worker intention information indicating that the corresponding worker intends to carry out the work. The set of worker intention information includes the worker No., the work ID, and the worker intension about whether the worker can carry out the work (YES or NO). Meanwhile, if each worker taps a pad "Schedule" 68 located in a lower portion of the display screen 60, then the screen 60 displays information representing one or more assisting works that have been assigned to the each worker, so that the each worker can see the assigned work or works.

5.4 Supplying-Work Assignment Confirmation Routine

Figure 11:
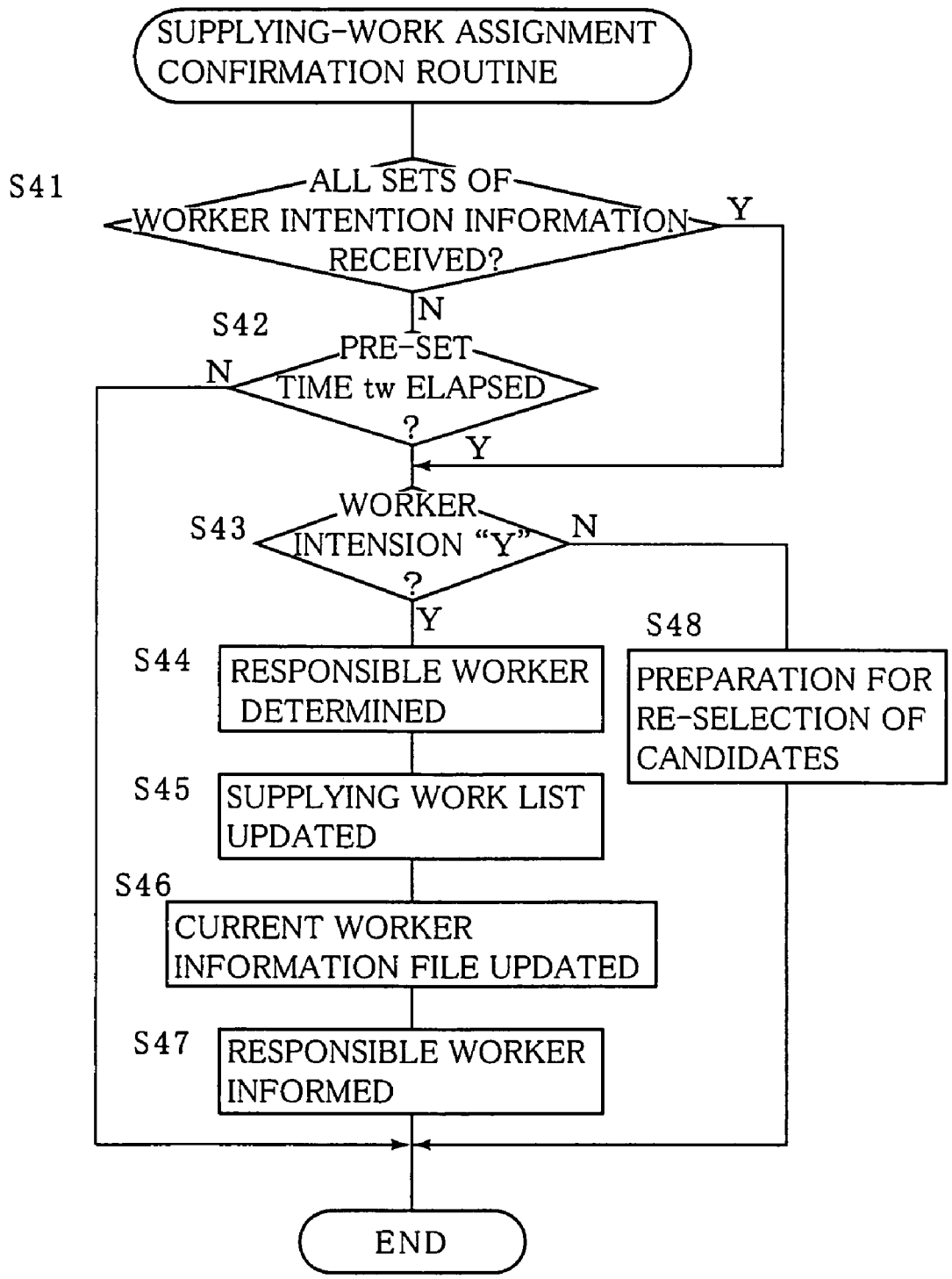
FIG. 11 is a flow chart representing a supplying-work assignment confirmation routine as another portion of the assisting-work management program.

Next, the supplying-work assignment confirmation routine implemented at Step S16 will be described. If at Step S13 the computer recognizes that the current worker information file has one or more work IDs recorded in the column of "temporarily assigned work", the computer judges that one or more temporarily assigned works are present, i.e., makes a positive judgment. For example, regarding the above-described assignment of the work N7, the workers W1, W2 are selected as the proper candidates, and each have the work ID, i.e., "N7" recorded in the column of "temporarily assigned work". Therefore, a positive judgment is made at Step S13, and the control goes to Step S16. FIG. 11 shows the supplying-work assignment confirmation routine implemented at Step S16. First, at Step S41, the computer judges whether the computer has received the respective sets of worker intention information from all the proper candidates. More specifically described, the computer checks whether all the candidates that have the work ID in the column of "temporarily assigned work" of the current worker information file have "Y" or "N" in the column of "worker intention". If at least one of the respective columns of "worker intention" of the workers W1, W2 is blank, a negative judgment is made at Step S41, and the control goes to Step S42 to judge whether a waiting time, tw, (i.e., 20 seconds) has elapsed since the temporary assignment of the highest-priority work. If a negative judgment is made at Step S42, Step S43 and the following steps are skipped, and the current control cycle according to the present supplying-work assignment confirmation routine is ended. On the other hand, if a positive judgment is made at Step S42, the control goes to Step S43. Thus, if the computer has obtained the respective sets of worker intention information from all the proper candidates, or if the waiting time tw has elapsed since the temporary assignment of the highest-priority work, then the computer makes a judgment at Step S43.

At Step S43, the computer judges whether the current work information file has at least one data "Y" recorded in the respective columns of "worker intention" of the proper candidates. If a positive judgment is made at Step S43, the control goes to Step S44. Here, it is assumed that the current work information file has the data "Y" recorded in each of the respective columns of "worker intention" of the two workers W1, W2. That is, it is assumed that in the above-described manner, both the workers W1, W2 have inputted, into their portable terminal devices 42, respective intentions that they can carry out the highest-degree work. Meanwhile, if the workers W1, W2 input, into their portable terminal devices 42, their intentions to carry out the work, then the computer updates, at Step S18 described later, the corresponding columns of "worker intention" in the current worker information file, i.e., record the data "Y" in each of the corresponding columns of "worker intention", as shown in FIG. 4.

At Step S44, the computer determines, based on the sets of worker intention information and the current worker information, a responsible worker who carries out the objective work. If there are a plurality of proper candidates having the data "Y" in the corresponding columns of "worker intention", the computer selects, as the responsible worker, one of those proper candidates who has the shortest time of the respective total times recorded in the respective columns of "total time of actual works (a sort of work amount)" of the current worker information file. For example, regarding the assignment of the work N7, the worker W1 has the shorter total time than that of the worker W2, and accordingly the worker W1 is selected as the responsible worker. In a special case where respective total times of a plurality of proper candidates are equal to each other, one of the proper candidates who has the earliest time of the respective finishing times recorded in their columns of "finishing time of previous work" (i.e., who has the longest time of the respective waiting times of the proper candidates), is selected as the responsible worker; and if the respective finishing times of the proper candidates are equal to each other, one of the proper candidates who has the smallest worker No. is selected as the responsible worker.

Step S44 is followed by Step S45 to update the supplying work list such that the worker No. (e.g., Wi regarding the assignment of the work N7) of the responsible worker is recorded in the column of "responsible worker" of the objective work (e.g., N7). Then, at Step S46, the computer updates the current worker information file, such that the work ID (e.g., N7) of the objective work is recorded in the colunm of "assigned work" of the responsible worker (e.g., W1), and the respective work IDs (e.g., N7) recorded in the respective columns of "temporarily assigned work" of the proper candidates (e.g., W1, W2) and the respective data "Y" or "N" (e.g., "Y") recorded in the respective columns of "worker intention" of the proper candidates are deleted. In addition, the computer updates the current worker information file, such that a scheduled finishing time of the earliest one of a plurality of assigned works is recorded in the column of "scheduled finishing time of assigned work" of the responsible worker (e.g., W1); a scheduled finishing time of the latest one of the assigned works is recorded in the column of "scheduled starting time of assigned work" of the responsible worker; and an area to which the latest one of the assigned works belongs is recorded in the column of "work finishing position" of the responsible worker. For example, regarding the assignment of the work N7, only the work N7 has been assigned to the worker W1 at the current time. Therefore, the work N7 is the earliest work and the latest work. Thus, the scheduled starting time (14:04:30), the scheduled finishing time (14:07:30), and the area (area B) to which the work N7 belongs are recorded in the column of "scheduled starting time of assigned work", the column of "scheduled starting time of assigned work", and the column of "work finishing position" of the worker W1, respectively, as shown in FIG. 12. Here, a method of calculating a scheduled starting time, and a scheduled finishing time, of a supplying work is described. Basically, a scheduled starting time of a supplying work is equal to a recommended arrival time of the supplying work. However, in the case where a supplying work needs taking a new material and is not the above-described dependent work, a scheduled starting time of the supplying work is equal to a time obtained by subtracting, from a recommended arrival time of the supplying work, a material taking time, i.e., a time needed to take the new material. Thus, the recommended arrival time, 04'30", of the work N7 is determined as the scheduled starting time of the same N7. A scheduled finishing time of a supplying work is equal to a time obtained by adding a standard needed time of the supplying work to a recommended arrival time of the same. Thus, the recommended arrival time (04'30") of the work N7, i.e., the solder supplying work; plus the standard needed time (3 minutes) of the same N7 is determined as the scheduled finishing time, 14:07:30, of the same N7. At Step S47, the computer informs the determined responsible worker of the fact that the objective work has been assigned to the worker. Though not shown, the display screen 62 of the portable terminal device 42 of the worker W1 displays the work-object code, recommended arrival time, material shortage time, and material code of the work N7, and informs, in an audible manner, the worker W1 of the fact that the supplying work has been assigned to the worker.

If the computer does not receive any sets of worker intention information, or receives only a negative answer or answers ("N"), from a proper candidate or candidates, within the time duration tw, then a negative judgment is made at Step S43, and the control goes to Step S48. For example, there is a case where the column of "worker intension" of the worker W1 is blank, and the column of "worker intension" of the worker W2 has the data "N". At Step S48, the computer operates for waiting, at Step S18, for receiving information newly inputted by the proper candidate or candidates who have not inputted their intentions, so that one or more proper candidates may be re-selected at Step S15, and additionally operates for re-selecting the proper candidates such that the re-selected proper candidates do not coincide with the initially selected proper candidates. The former operation is performed by deleting the temporarily assigned works from the current worker information. In this case, since there are no temporarily assigned works, a negative judgment is made at Step S13, and the control goes to Steps S14 and S15. The latter operation is performed by assigning a 'dummy' work to the initial proper candidates in the current worker information file. That is, the respective "scheduled starting times of assigned works", and the respective "scheduled finishing times of assigned works", corresponding to the initial proper candidates are updated in the same manner as the manner in which the objective work is formally assigned to the responsible worker. Therefore, when one or more proper candidates are re-selected at Step S15, the computer recognizes that when the objective work is carried out, the initial proper candidates must be carrying out other works. Thus, when one or more proper candidates are re-selected, a dummy work has been assigned to the initial proper candidates. Therefore, one or more workers who are located at respective positions remoter from the work place than the positions where the initial proper candidates are located, are re-selected as proper candidates.

5.5 Reception of Input Information

Next, Steps S17 and S18, shown in FIG. 7, will be described. If the assisting-work management device 36 receives a set of worker input information, a positive judgment is made at Step S17, and the control goes to Step S18 where the computer updates, based on the received information, various sorts of information. When a worker inputs, into the corresponding portable terminal device 42, his or her intention to carry out a pending work, the terminal device 42 sends, as a set of worker input information, a set of worker intention information to the assisting-work management device 36, so that the management device 36 updates the corresponding column of "worker intention" in the current worker information, shown in FIG. 4. When a worker inputs, into a substrate-related-operation performing machine 10, information indicating that he or she has finished an assisting work on the machine 10, the machine 10 sends, as a set of worker input information, the inputted information to the assisting-work management device 36, so that the management device 36 judges that the assisting work has been finished and updates the current worker information file, the supplying work list, and/or the recovering work list. For example, when the worker W5 inputs, into the input device of the general-purpose component mounting machine 10XY, information indicating that he or she has finished the work N1, i.e., the reel replacing work, the assisting-work management device 36 updates the current worker information file, with respect to the worker W5, from the state shown in FIG. 4 to the state shown in FIG. 12. More specifically described, with respect to the worker W5, the work N1 is deleted from the column of "assigned work"; —waiting— is recorded in the column of "working state"; the respective columns of "scheduled starting time of assigned work" and "scheduled finishing time of assigned work" are updated by being calculated in the above-described manner; a time needed to carry out the work N1 is added to the current total time recorded in the column of "total time of actual works"; and the finishing time of the work N1 is recorded in the column of "finishing time of previous work". In addition, the information related to the work N1 is recorded in an assisting-work history, and is deleted from the supplying work list. Meanwhile, when a recovering work is finished, the current work information file and the recovering work list are updated in a similar manner.

5.6 Assignment of Work N8

While the foregoing description relates to the assignment of the work N7, i.e., an assisting work whose needed skill level is "H", the following description relates to an assignment of a work N8, i.e., an assisting work whose needed skill level is "L". The following description is focused on Step S33 that is skipped in the foregoing description, i.e., a determination of one or more near-position continuous works, and Step S34 where one or more proper candidates are selected in the case where at least one work ID is recorded in the columns of "assigned work" of the current worker information. When the current time becomes equal to 14:01:40 after the assignment of the work N7, the temporary supplying-work assignment routine is started, and the work N8 is determined as the highest-priority work (at Step S31 of FIG. 9).

Since the needed skill level of the work N8 is "L" and the work N8 is not the syringe replacing work, a positive judgment is made at Step S32 and the control goes to Step S33 where the computer determines one or more near-position continuous works (hereinafter, simply referred to as the "near continuous work(s)", where appropriate). At Step S33, the computer regards the highest-priority work as a first near continuous work, and searches for a second near continuous work to be carried out following the first near continuous work, and a third near continuous work to be carried out following the second near continuous work. In the present embodiment, the computer selects, as those near continuous works, supplying works that belong to the same area as the area to which the highest-priority work (the work N8) belongs, that each have the needed skill level "L", and that can be continuously carried out by one worker. More specifically described, the second and third near continuous works are selected from the supplying works that are to be carried out in the same area as the area to which the highest-priority work belongs and that each need the skill level "L", in the following manner: First, the computer selects, as the second near continuous work, a supplying work whose recommended arrival time falls within a pre-set time duration following the scheduled finishing time of the highest-priority work. If there are a plurality of supplying works whose recommended arrival times fall within the pre-set time duration, then the computer selects, as the second near continuous work, one of the supplying works that has the earliest recommended arrival time. The reason why the pre-set time duration following the scheduled finishing time of the highest-priority work is used to select the second near continuous work is to make not too long a work-free time interval between the end of one supplying work and the start of the next supplying work. If the second near continuous work is selected, then the computer selects, as the third near continuous work, a supplying work whose recommended arrival time falls within a pre-set time duration following the scheduled finishing time of the second near continuous work. If there are a plurality of supplying works whose recommended arrival times fall within the pre-set time duration, then the computer selects the third near continuous work in the same manner as described above, i.e., one of the supplying works that has the earliest recommended arrival time. Basically, the total number of the near continuous works determined by the computer is not limited. However, in the present embodiment, at most three near continuous works are determined. If a plurality of near continuous works are determined, then those near continuous works are assigned, as objective works, to one worker. Hereinafter, the second and third near continuous works will be referred to as the "dependent works", where appropriate.

Next, there will be described how Step S33 is implemented in assigning the work N8. The work N8 is the feeder replacing work ($\overline{C}$ X$\overline{Y}$ 213), and the scheduled finishing time of the work N8 is 14:06:40 obtained by adding a standard needed time (1 minute) to the recommended arrival time (14:05:40) thereof. The computer judges that any supplying work whose recommended arrival time falls within the pre-set time duration (e.g., 2minutes) from the time 06'40", which belongs to the area C, and whose needed skill level is "L" can be carried out. Since the work N12, i.e., the feeder replacing work RO ($\overline{C}$ R$\overline{O}$ 205) has the recommended arrival time, 7'00", and belongs to the area C, the work N12 is selected as the second near continuous work. Subsequently, the computer selects the third near continuous work from one or more supplying works that belong to the same area as the area C to which the work N8, i.e., the second near continuous work belongs, and whose needed skill level is "L". More specifically described, the computer determines the scheduled finishing time (7'30") of the work N8, and searches for one or more supplying works whose recommended arrival times fall within the pre-set time following the scheduled finishing time. Regarding the present example, however, the computer cannot find any candidates for the third near continuous work. Therefore, the computer determines the work N8 and the work N12 as the near continuous works, and updates the supplying work list such that data "1" and data "N8" are recorded in the respective columns of "near continuous work" of the work N8 and the work N12. The data "1" indicates the number of the near continuous work(s) to be carried out following the work N8; and the data "N8" indicates the work ID of the highest-priority work. Since the works N8, N12 as the near continuous works are assigned, as the objective works, to one worker, a total amount of movement of that worker can be reduced. In addition, when the worker moves to a corresponding one of the electronic-component storage places 46, the worker can take or obtain both a new feeder needed by the work N8 to replace the current feeder of the general-purpose component mounting machine 10XY, and a new feeder needed by the work N12 to replace the current feeder of the high-speed component mounting machine 10RG. Therefore, the worker need not do two reciprocations, i.e., needs to do just one reciprocation. That is, since a plurality of assisting works out of a great number of assisting works can be carried out at once by one worker, a sum of respective burdens applied to the workers can be reduced as a whole.

At Step S34, the computer selects, based on the pre-set worker information and the current worker information, a responsible worker to carry out the objective works. First, the computer selects, based on the respective responsibility sections of the workers W1 through W5, all the workers W1 through W5 as the first candidates. From the first candidates, the computer selects, as the second candidates, the workers W3 through W5 whose worker skill levels are "L". Then, from the second candidates, the computer selects the third candidates, based on the respective "scheduled finishing times of assigned works" of the workers W3 through W5. That is, the computer refers to the respective columns of "scheduled finishing time of assigned work" of the workers W3 through W5 in the current worker information file, and selects, as one or more third candidates, one or more workers who can carry out the objective works. More specifically described, the computer judges (a) that one or more workers who have no data recorded in the corresponding columns of "scheduled finishing time of assigned work" can carry out the objective works, like in the above-described assignment of the work N7. In addition, (b) regarding one or more workers who have some data in the corresponding columns of "scheduled finishing time of assigned work", the computer judges whether those workers can carry out the objective works while taking into account respective movement times needed to move from the respective "work finishing positions" thereof to the position where the highest-priority work is to be carried out. That is, if a time obtained by adding a movement time to a scheduled finishing time of assigned work of a worker is prior to the scheduled starting time of the highest-priority work, then the computer judges that the worker can carry out the objective works. In the present embodiment, a movement time is obtained as an among-area movement time that is needed by each worker to move among the three areas A, B, C corresponding to the three substrate-related-operation performing groups 12A, B, C, respectively. An among-area movement time with respect to a movement within each area is T0 (0 second); an among-area movement time with respect to a movement between two areas A-B, B-C is Ta (15 seconds); and an among-area movement time with respect to a movement between two areas A-C is Tb (30 seconds).

Regarding the assignment of the work N8, the computer judges, at Step S34, whether each of the workers W3 through W5 can carry out the objective works. Since the work finishing position of the worker W3 is the area A (FIG. 12), an among-area movement time needed to move from the area A to the area C where the work N8 ($\overline{C}$ X$\overline{Y}$ 213) is to be carried out is 30 seconds. Since a time, 04'00", obtained by adding the among-area movement time (30 seconds) to the scheduled finishing time (03'30") of assigned work of the worker W3 is prior to the scheduled starting time (04'40") of the work N8, the computer judges that the worker W3 can carry out the work N8. Likewise, regarding the workers W4, W5, the computer obtains a time, 02'55", by adding the among-area movement time (15 seconds) to the scheduled finishing time of assigned work of the worker W4, and obtains a time, 03'40", by adding the among-area movement time (0 second) to the scheduled finishing time of assigned work of the worker W5. Therefore, the computer judges that the workers W4, W5 can carry out the work N8. Consequently the computer selects the workers W3 through W5 as the third candidates. Finally, the computer selects one or more proper candidates based on the position information. More specifically described, the computer selects, as a proper candidate, the worker W5 who is present in the same area C as the area C where the work N8 ($\overline{C}$ X$\overline{Y}$ 213) is to be carried out. However, in the case where there is no third candidate selected by the computer, the computer selects, as a proper candidate, one of the second candidates who has the earliest one of respective times obtained by adding the respective among-area movement times (as a sort of movement time) of the second candidates to the respective scheduled finishing times of assigned works of the same.

Then, the computer updates the current worker information file such that "N8" as the work ID is recorded in the column of "temporarily assigned work" of the worker W5 (at Step S35), and informs the worker W5 of the works N8, N12 as pending works for which a responsible worker has not been determined yet (at Step S36). If the worker W5 inputs information indicating his or her intention to carry out the pending works, the computer records the data "Y" in the column of "worker intention" of the worker W5 (at Step S18), and additionally records the data "W5" in each of the respective columns of "responsible worker" of the works N8, N12 in the supplying work list. That is, the current worker information file is updated, and the works N8, N12 are additionally recorded in the column of "assigned work" of the worker W5. In addition, regarding the worker W5, the column of "scheduled starting time of assigned work", the column of "scheduled finishing time of assigned work", and the column of "work finishing position" are updated to "14:04:40", "14:07:30", and "C", respectively, and the data "N8" and the data "Y" are deleted from the column of "temporarily assigned work" and the column of "worker intention", respectively (at Step S46). Then, the computer informs the worker W5 of the thus confirmed, assigned works N8, N12 (at Step S47). On the other hand, if the worker W5 inputs information indicating his or her intention not to carry out the pending works, then the control goes to Step S48 and then goes to Step S15 to re-select one or more proper candidates to carry out the works N8, N12. Consequently the computer selects the worker W4 as a proper candidate.

Thus, regarding the assignment of each supplying work, the operation of selecting the proper candidate(s) is a portion of the operation of determining the responsible worker. The assisting-work management device 36 determines, at Steps S15 and S16, the responsible worker based on the pre-set worker information, the current worker information, and the respective intensions of the workers (i.e., the sets of worker intention information).

5.7 Assignment of Recovering Work

Figure 13:
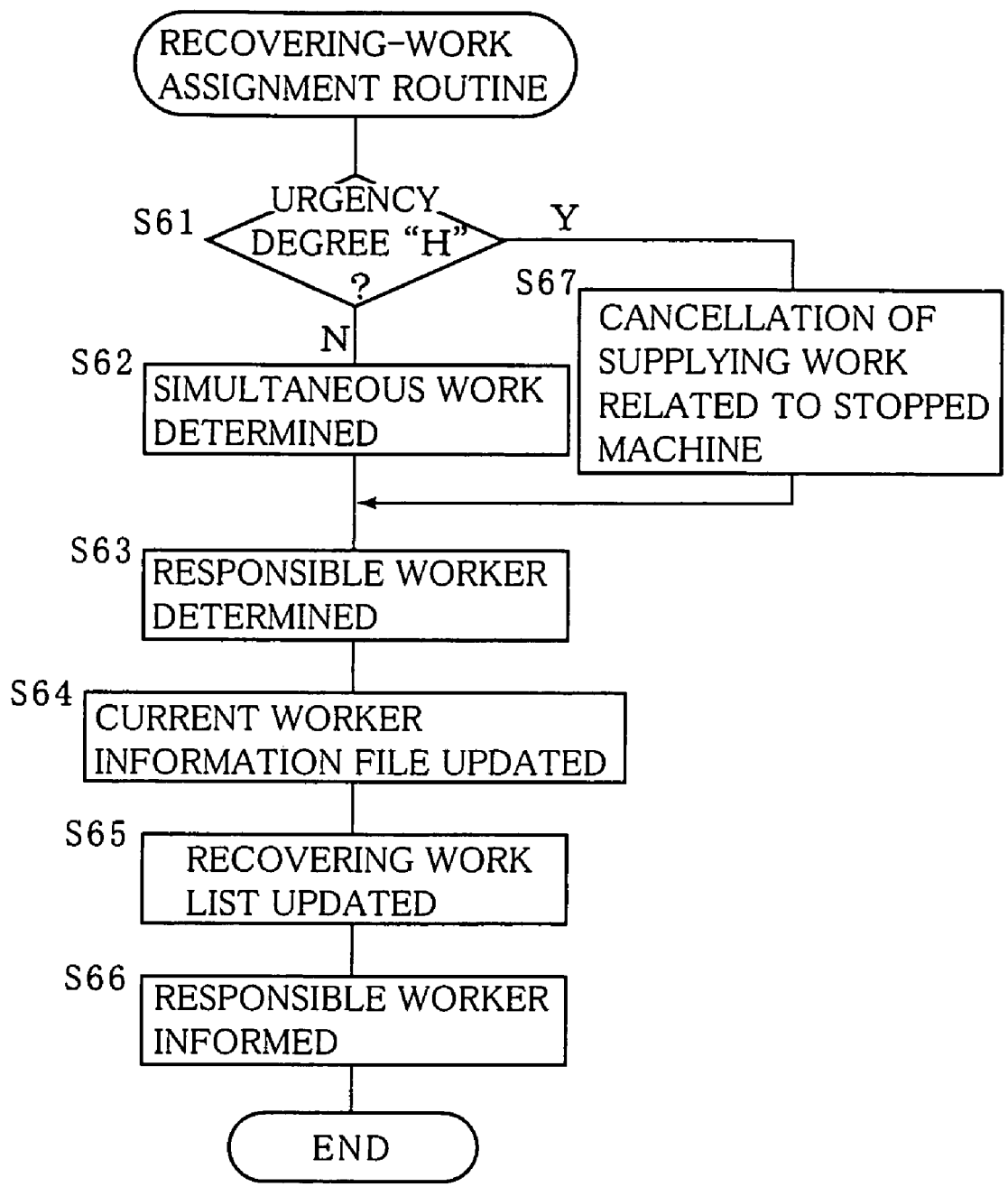
FIG. 13 is a flow chart representing a recovering-work assignment routine as another portion of the assisting-work management program.

The foregoing description of the assignment of each supplying work has been made on the assumption that no recovering works occur. However, the following description of an assignment of each recovering work will be made on an assumption that a recovering work had occurred back in the past. Here, it is assumed that the supplying works occur as indicated in the supplying work list of FIG. 5. If the assisting-work management device 36 receives a set of recovering work occurrence information and records a recovering work in the recovering work list (as shown in FIG. 6), then a positive judgment is made at Step S11 (FIG. 7), and the control goes to Step S12, i.e., a recovering-work assignment routine shown in FIG. 13. An assignment of a recovering work means that the recovering work recorded in the recovering work list is assigned as an objective work to a worker. First, at Step S61, the computer refers to an urgency degree of the recovering work, recorded in the recovering work list shown in FIG. 6. If the urgency degree is "L", a negative judgment is made at Step S61, and the control goes to Step S62 to determine simultaneous works. More specifically described, at Step S62, the computer searches for one or more supplying works whose recommended arrival times fall within a pre-set time duration following a time of occurrence of the recovering work, which need stopping of the operation of the substrate-related-operation performing machine 10 as the object of the recovering work, and which can be simultaneously carried out by other workers than a responsible worker for the recovering work. For example, regarding the recovering work E1, a work-object code of the work E1 is C-XY-4N3, and one or more supplying works that can be carried out simultaneously with the work E1 are works that need stopping of the operation of the general-purpose component mounting machine 10XY of the substrate-related-operation performing group 12C (hereinafter, abbreviated to the "machine C-XY"). More specifically described, the computer searches, in the supplying work list, for a supplying work whose recommended arrival time is subsequent to 00'40" obtained by adding a margin time (e.g., 30 seconds), such as a movement time, to the time (00'10") of occurrence of the work E1 and falls within the pre-set time (e.g., 5 minutes) following the occurrence time, and which needs stopping of the operation of the machine C-XY. Consequently the computer determines, as a simultaneous work for the work E1, the work N5 (C-XY-411) whose recommended arrival time is 02'40". In this case, a recovering work (e.g., the work E1) and a different assisting work (e.g., the work N5) are determined as a plurality of simultaneous works for each other. In the case where the computer searches and finds a plurality of supplying works each of which can qualify as a simultaneous work, one of those supplying works that has the earliest time to carry out is finally determined as a simultaneous work. On the other hand, in the case where the computer cannot find any supplying works that can qualify as a simultaneous work or works, no simultaneous work is determined.

At Step S63, the computer determines, based on the pre-set worker information and the current worker information, a responsible worker to carry out the recovering work as the objective work. This determination are basically similar to the selection of proper candidate(s) for each supplying work and the determination of responsible worker for the each supplying work. However, this determination does not include obtaining any sets of worker intention information from any workers, but includes determining a single responsible worker and informing the worker of the fact that the recovering work has been assigned to the worker. First, regarding the selection based on the pre-set worker information, the computer refers, like the case of the above-described temporary assignment of each supplying work, to the pre-set worker information file (FIG. 3) with respect to the respective columns of "responsibility section" and the respective columns of "worker skill level" of all the workers W1 through W5. Consequently the computer selects, as one or more first candidates, one or more workers the responsibility section of each of whom covers the recovering work, and then selects, as one or more second candidates, one or more selected first workers the worker skill level of each of whom is equal to the needed skill level of the recovering work. Subsequently, the computer selects, as one or more third candidates, one or more selected second candidates, based on respective assignment states thereof each as a sort of the current worker information. More specifically described, the computer refers to the current worker information file (FIG. 4) with respect to the respective columns of "scheduled starting time of assigned work" and the respective columns of "scheduled finishing time of assigned work" corresponding to the second candidates and, in short, the computer selects, as one or more third candidates, one or more second candidates each of whom can carry out the recovering work, prior to the scheduled starting time of assigned work of the each candidate or subsequent to the scheduled finishing time of assigned work of the each candidate. The selection of third candidates will be explained with respect to some exemplary cases. Case (a): A worker who has no time data recorded in the corresponding column of "scheduled starting time of assigned work" or the corresponding column of "scheduled finishing time of assigned work", has no assigned works. Therefore the worker can carry out the recovering work, and is selected as a third candidate. Case (b): A worker who has time data recorded in the corresponding columns of "scheduled starting time of assigned work" and "scheduled finishing time of assigned work", has one or more assigned works. In this case, basically, the worker is selected as a third candidate if a time obtained by subtracting, from the scheduled starting time of assigned work of the worker, an among-area movement time (i.e., a movement time needed to move from the area to which the recovering work belongs, to the area to which the earliest one of the assigned work(s) belongs) is later than a time obtained by adding, to the time of occurrence of the recovering work, the margin time (30 seconds) and an appropriate standard needed time. However, in the case where the recovering work has a simultaneous work determined therefor, the worker is selected as a third candidate if the time obtained by subtracting, from the scheduled starting time of assigned work of the worker, the among-area movement time is later than a time obtained by adding, to the recommended arrival time of the simultaneous work other than the recovering work, an appropriate standard needed time. In each case, if there is a single third candidate selected by the computer, then the single third candidate is determined as a responsible worker; and if there are no third candidates selected by the computer, then one of the workers who has the earliest one of respective times obtained by adding respective among-area movement times to the respective scheduled starting times of assigned works of those workers, is determined as a responsible worker. If there are a plurality of third candidates selected by the computer, then the computer determines a responsible worker based on the position information, the work-amount information, etc. More specifically described, a worker whose work finishing position is near to the work place, a worker whose total time of actual works is short, a worker whose finishing time of previous work is early, or a worker whose work ID is small is selected in the order of description, till only a single candidate is selected (in this connection, reference is made to the above-described assignment of each supplying work). For example, regarding the assignment of the work E1, the computer selects, as the first candidates, the workers W1 through W5 whose responsibility sections cover the area C. From the thus selected first candidates, the computer selects, as the second candidates, the workers W1, W2 whose worker skill levels are "H" corresponding to the needed skill level "H" of the work E1. From the thus selected second candidates, the computer refers to the respective assignment states of the workers W1, W2, and selects, as the third candidates, both the workers W1, W2 who have no assigned works, as shown in FIG. 4. Since there are the plurality of third candidates, the computer refers to the respective columns of "work finishing position" of the two workers, and determines, as a responsible worker for the work E1 as the objective work, the worker W2 who is nearer to the area C as the work place where the work E1 is to be carried out.

At Step S64, the computer updates the current worker information file such that the work ID (E1) of the recovering work is recorded in the column of "assigned work" of the responsible worker (W2), and the corresponding data are recorded in the columns of "scheduled starting time of assigned work", "scheduled finishing time of assigned work", and "work finishing position" of the same (FIG. 15). As described above, the "scheduled starting time of assigned work" means a scheduled starting time of the earliest one of the assigned works; and the "scheduled finishing time of assigned work" means a scheduled finishing time of the latest one of the assigned works. A method of calculating a scheduled starting time and a scheduled finishing time that are related to each recovering work will be described below. Case (a): if a recovering work has a simultaneous work, a scheduled starting time of the recovering work is the same as a recommended arrival time of the simultaneous work. Case (b): if a recovering work does not have a simultaneous work and it is the earliest one of the assigned works, a scheduled starting time of the recovering work is a time obtained by adding the margin time (30 seconds) to the time of occurrence of the recovering work. Case (c): if a recovering work does not have a simultaneous work and the assigned works includes a previous work to be carried out immediately before the recovering work, a scheduled starting time of the recovering work is a time obtained by adding an among-area movement time to the scheduled finishing time of the previous work. A scheduled finishing time of each recovering work is a time obtained by adding an appropriate standard needed time to the scheduled starting time of the work. For example, regarding the assignment of the work E1, the work E1 has the work N5 as the simultaneous work. Therefore, a scheduled starting time of the work E1 is a recommended arrival time (02'40") of the work N5; and a scheduled finishing time of the work E1 is a time (03'40") obtained by adding an appropriate standard needed time to the recommended arrival time. A work-finishing position of the work E1 is the area C where the work E1 is carried out. At Step S65, the computer updates the recovering work list such that the worker No. (W2) is recorded in the column of "responsible worker" of the objective work (E1). Then, at Step S66, the computer informs the responsible worker (W2) of the work-object code (C-XY-4N3) and work name ('nozzle replacing work') of the objective work (E1), and the recommended arrival time of the simultaneous work. When the recovering work is finished and the operation of the substrate-related-operation performing machine 10(XY) is resumed, the computer records, in the assisting-work history, the information related to the recovering work (E1), and deletes the information from the recovering work list.

Next, there will be described a case where a recovering work whose urgency degree is "H". For example, it is assumed that after the above-described work E1 is assigned to the worker W2 and is carried out by the same W2, the operation of the high-speed component mounting machine 10RO of the substrate-related-operation performing group 12C is stopped at 14:04:20 because of a failure, i.e., an error of processing of image data. Then, the machine management device 32 sends a set of recovering work occurrence information to the assisting-work management device 36, so that the corresponding recovering work is recorded as a work E2 in the recovering work list (as shown in FIG. 14). Consequently the work E2 is determined as an objective work, and an assignment of the work E2 is started. Since an urgency degree of the work E2 (C-RO-PC) is "H", a positive judgment is made at Step S61, and the control goes to Step S67. At Step S67, the computer informs a responsible worker for the substrate-related-operation performing machine 10 the operation of which has been stopped because of its failure, of a fact that the assignment of a supplying work to that machine 10 is canceled, and additionally updates the current worker information file and the supplying work list. At the time of 04'20", the worker W5 has an assigned work N12 (C-RO-205), as shown in FIG. 16, and accordingly the computer informs the worker W5 of a fact that the work N12 is canceled because of an abnormal stopping of the operation of the machine 10. In addition, the computer updates the current worker information file such that the work ID "N12" is deleted from the column of "assigned work" of the worker W5 and accordingly the column of "scheduled finishing time of assigned work", etc of the worker W5 is changed. In addition, the work ID "N12" is deleted from the supplying work list.

At Step S63, the computer determines a responsible worker for the recovering work as the objective work, in the same manner as the above-described manner in which the work E1 is assigned. However, regarding the selection of third candidate(s) based on the assignment state(s) of the second candidate(s), if there is no worker who has no assigned work, or no worker who has such an assignment state that a time obtained by subtracting an among-area movement time from a scheduled starting time of assigned work is later than a time obtained by adding, to the time of occurrence of the recovering work, the margin time (30 seconds) and an appropriate standard needed time, then a responsible worker is determined in the following manner: In short, a worker who can readily carry out the recovering work is selected as the responsible worker. Case (a): If there is one or more workers whose working states are —waiting—, a worker having the latest time of respective times obtained by subtracting, from the respective scheduled starting times of assigned works of the workers, respective among-area movement times needed to move from the respective current positions to the work place is determined as the responsible worker. Case (b): If all the workers are —working—, a worker having the earliest time of respective times obtained by adding, to the respective scheduled finishing times of the respective current works of the workers, respective among-area movement times (i.e., respective times needed to move from the respective areas to which the current works belong, to the area to which the recovering work belongs) is determined as the responsible worker. The assignment of the work E2 differs from the assignment of the work E1, because the recovering work whose urgency degree is "H" should be carried out as soon as possible. Regarding the assignment of the work E2, both the workers W1, W2 are —waiting—, as shown in FIG. 16, but the worker W1 has the assigned work "N7". Therefore, the worker W2 is determined as the responsible worker for the work E2 as the objective work.

At Step S64, the work ID (E2) of the recovering work is added as an assigned work of the responsible worker (W2) in the current worker information file, though not shown, and the columns of "scheduled starting time of assigned work", "scheduled finishing time of assigned work", and "work finishing position" of the worker are updated to 14:04:50, 14:09:50, and the area A, respectively. In addition, the worker No. (W2) is recorded in the column of "responsible worker" of the objective work (E2) in the recovering work list, and then the responsible worker (W2) is informed of the work-object code (C-RO-PC) and the work name (—image-recognition-condition adjustment—) of the objective work (W2), at Steps S65 and S66.

6. Block Diagram of Various Functions of Assisting-Work Management Device

Figure 17:
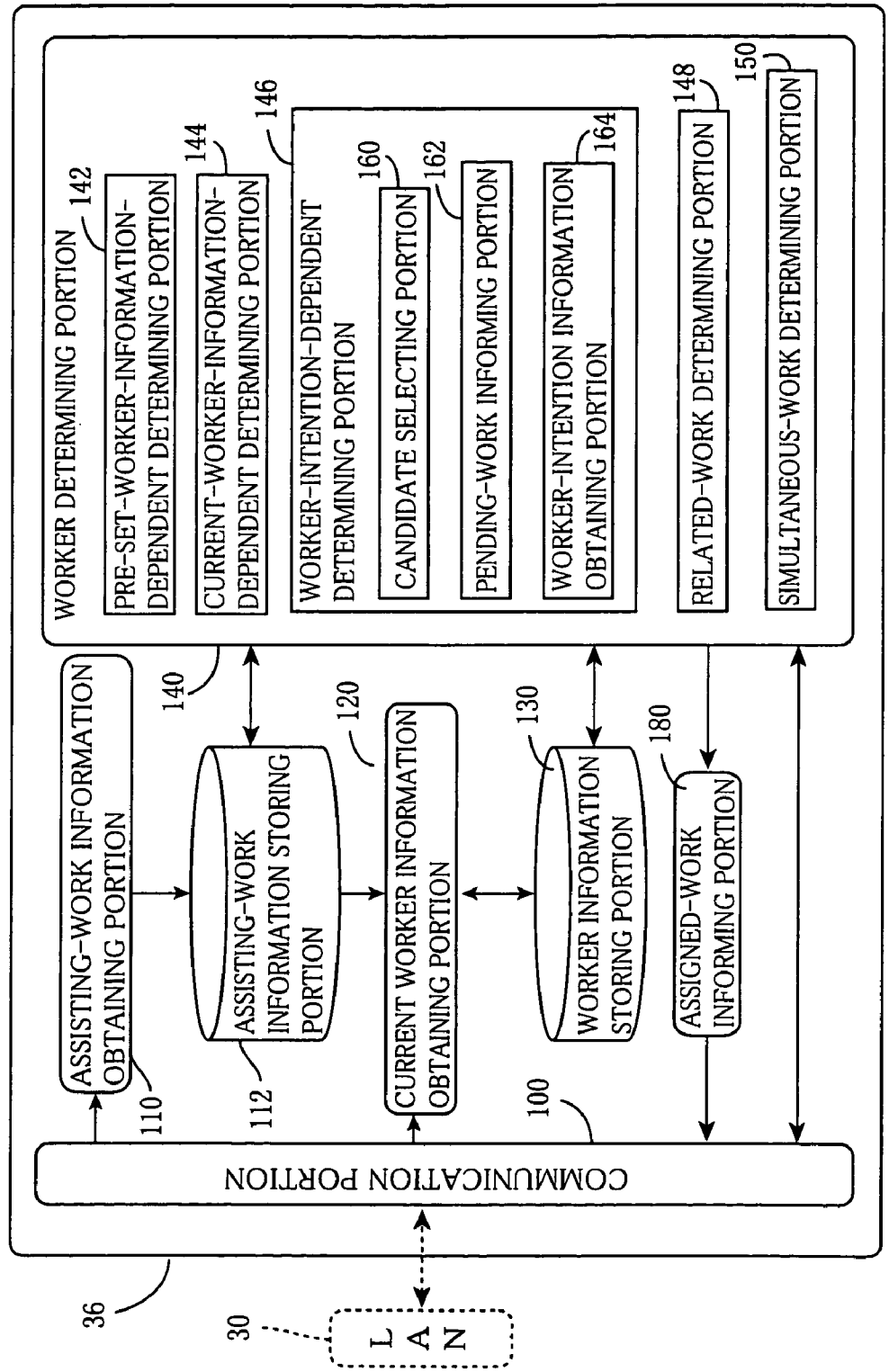
FIG. 17 is a block diagram representing various functions of an assisting-work management apparatus as an embodiment of the present invention.

FIG. 17 shows various functional portions of the assisting-work management device 36 that cannot be structurally discriminated from each other. However, those functional portions include respective portions of the assisting-work management device 36 that can carry out respective contributory operations. The assisting-work management device 36 includes a communication portion 100, an assisting-work information obtaining portion 110, an assisting-work information storing portion 112, a current worker information obtaining portion 120, a worker information storing portion 130, a responsible worker determining portion 140, and an assigned-work informing portion 180. The communication portion 100 sends and receives various sorts of information to and from the portable terminal devices 42 and the machine management device 32 via the LAN 30. The assisting-work information obtaining portion 110 obtains, from the machine management device 32, the sets of supplying-work occurrence information and the sets of recovering-work occurrence information, and stores, in the assisting-work information storing portion 112, the obtained sets of supplying-work occurrence information as the supplying work list, and additionally stores the obtained sets of recovering-work occurrence information as the recovering work list, or updates the supplying work list and the recovering work list each stored by the assisting-work information storing portion 112. The assisting-work information storing portion 112 includes a portion of the memory device of the assisting-work management device 36. The current worker information obtaining portion 120 updates, at Steps S18, S35, S46, and S64, the current worker information file based on the sets of worker input information, the current worker information file, the supplying work list, and the recovering work list. The worker information storing portion 130 includes a portion of the memory device of the assisting-work management device 36, and stores the pre-set worker information as the worker master file, and additionally stores the current worker information as the current worker information file. The current worker information file is updated by the above-described current worker information obtaining portion 120.

The responsible worker determining portion 140 includes a pre-set-worker-information-dependent determining portion 142, a current-worker-information-dependent determining portion 144, a worker-intention-dependent determining portion 146, a related-work determining portion 148, and a simultaneous-work determining portion 150. The pre-set-worker-information-dependent determining portion 142 selects, at Steps S34, S44, and S63, the candidates to carry out the objective work, and determines the responsible worker based on the respective responsibility sections and respective worker skill levels of the candidates (the step of selecting the candidates is a portion of the step of determining the responsible worker). The current-worker-information-dependent determining portion 144 selects, at Steps S34, S44, and S63, the candidates to carry out the objective work, and determines the responsible worker based on the respective working states of the workers (S63), the respective assignment states and respective positions of the workers (S34, S63), or the respective work amounts of the candidates (S44, S63). The worker-intention-dependent determining portion 146 includes a candidate selecting portion 160, a pending-work informing portion 162, and a worker intention information obtaining portion 164, and determines, at Step S44, the responsible worker based on the sets of worker intention information. The candidate selecting portion 160 selects, at Step S34, the candidates to carry out the objective work, based on the pre-set worker information and the current worker information. The worker intention information obtaining portion 164 obtains, at Step S18, the sets of worker intention information and updates the corresponding columns of "worker intention" in the current worker information file. The related-work determining portion 148 determines, at Step S33, a plurality of near-position continuous works, and deals with, at Steps S34 and S44, the plurality of near-position continuous works as a plurality of objective works and determines the responsible worker to carry out the objective works. The simultaneous-work determining portion 150 determines, at Step S62, the simultaneous work to be carried out simultaneously with the objective work, and determines, at Step S63, the responsible worker to carry out the objective work. The assigned-work informing portion 180 informs, at Steps S47 and S66, the responsible worker of the objective work assigned to the worker.

OTHER EMBODIMENTS

In the above-described embodiment, the assisting-work management device 36 can concurrently obtain a plurality of sets of information related to a plurality of assisting works, respectively. However, the assisting-work management device 36 may be modified to be able to obtain, at once, one set of information related to one assisting work. For example, the assisting-work management device 36 may be one that determines, each time it receives one set of assisting-work-related information from the substrate-related-operation performing machines 10 or the machine management device 32, a responsible worker to carry out the assisting work. The assisting-work management device 36 can receive a set of assisting-work occurrence information from an arbitrary one of the substrate-related-operation performing machines 10, for example, if the machine 10 is adapted to send, at a time when an amount of consumption of components of any sort used therein is increased up to a pre-set amount, or a remaining amount of the components is decreased down to a pre-set amount, or at a time prior by a pre-set time to an estimated time when the components will run short, information indicating that situation. In addition, the assisting-work management device 36 can receive a set of assisting-work occurrence information from the machine management device 32, for example, if the latter device 32 is adapted to send the set of information when being commanded by the former device 36 to send the set of information.

In the above-described embodiment, the assisting-work management device 36 manages the supplying works and the recovering works. However, the assisting-work management device 36 may be modified to manage at least one sort of works pr-selected from supplying works, recovering works, maintenance works, and resetting works. In the above-described embodiment, the assignment of each supplying work involves the temporary assignment thereof, whereas the assignment of each recovering work does not involve a temporary assignment thereof. However, it is possible to assign each of the above-indicated two sorts of works with, or without, the temporary assignment thereof. In the above-described embodiment, the assisting works whose needed skill levels are "L" are not assigned to any skilled workers whose worker skill levels are "H". However, the assisting-work management device 36 may be modified to assign those assigning works to those skilled workers, depending upon the burden of the maintenance works carried out by the skilled workers, and/or the proportion of the total number of the skilled workers relative to that of the ordinary workers. In the above-described embodiment, the position of each worker is or recognized in terms of the three areas A, B, C. However, each of the areas may be narrowed, and accordingly the total number of the areas may be increased. For example, a section including a place where a worker carries out an assisting work for each substrate-related-operation performing machine 10 may be pre-set as an area. If each of the areas is narrowed and the total number of the areas is increased, then the position of each worker can be recognized more precisely and accordingly the amount of movement of the each worker can be estimated more accurately. This leads to assigning each assisting work to a more appropriate worker. In the above-described embodiment, the near-position continuous works are assisting works belonging to a same area. However, in the case where each of the areas is narrowed, two assisting works may be determined as near-position continuous works, even though those assisting works may belong to different areas, so long as one of the areas is located within a pre-set range from the other area. In the above-described embodiment, the position of each worker is estimated based on the set of worker input information inputted by the each worker. However, each worker may carry a signal transmitter, and the position of the each worker may be estimated by detecting, with a sensor, the signal transmitted by the transmitter. Alternatively, each worker may input his or her current position into his or her portable terminal device 42, and the position of the each worker may be estimated based on the inputted position. In the above-described embodiment, the portable terminal devices 42 including the respective input devices cooperate with the substrate-related-operation performing machines 10, and a portion of the current-worker-information obtaining portion 120 that estimates the current position the work finishing position of each worker, to constitute a worker-position obtaining device.

The invention claimed is:

1. A managing apparatus for managing an assisting work to assist a substrate-related-operation performing system comprising a plurality of substrate-related-operation performing machines each of which performs a substrate-related operation that is related to a circuit substrate, the assisting work being carried out, as needed, when the substrate-related operation performing system is operated, and comprising at least one of a supplying work to supply a material or a part which is consumed or worn during the substrate-related operation, and a recovering work to remove a cause of a failure of at least one of the substrate-related-operation performing machines, the managing apparatus assigning, each time a need to carry out the assisting work occurs, the assisting work to one of a plurality of workers, the managing apparatus comprising an assisting-work occurrence information obtaining portion which obtains, from the substrate-related-operation performing machines, assisting-work occurrence information which is related to occurrence of a need to carry out at least one assisting work and which represents an object and a sort of said at least one assisting work and a time to carry out said at least one assisting work; and a worker determining portion which determines, based on the assisting-work occurrence information obtained by the assisting-work occurrence information obtaining portion, one of the workers who is appropriate to carry out said at least one assisting work as at least one objective work, so that said at least one objective work is assigned to said one worker.

2. The managing apparatus according to claim 1, wherein the worker determining portion comprises a pre-set-worker-information-dependent determining portion which determines said one worker based on a plurality of sets of pre-set worker information that are pre-set for the workers, respectively.

3. The managing apparatus according to claim 2, wherein the pre-set-worker-information-dependent determining portion determines said one worker based on the sets of pre-set worker information each set of which comprises at least one of a worker skill level and a responsibility section of a corresponding one of the workers.

4. The managing apparatus according to claim 1, further comprising a current-worker-information obtaining portion which obtains a plurality of sets of current worker information representing respective current states of the workers,
    wherein the worker determining portion comprises a current-worker-information-dependent determining portion which determines said one worker based on the obtained sets of current worker information.

5. The managing apparatus according to claim 4, wherein the current-worker-information-dependent determining portion determines said one worker based on the sets of current worker information each set of which comprises at least one of a working state, a position around the substrate-related-operation performing system, an amount of work, and an assignment state of a corresponding one of the workers.

6. The managing apparatus according to claim 1, wherein the worker determining portion comprises a worker-intention-dependent determining portion which determines said one worker based on an intention of said one worker.

7. The managing apparatus according to claim 6, wherein the worker-intention-dependent determining portion comprises
    a pending-work-related informing portion which informs each of at least one of the workers of said at least one objective work which has not been assigned, and
    a worker-intention-information obtaining portion which obtains, from at least one of the at least one informed worker, at least one set of worker intention information representing the intention of said at least one worker about whether said at least one worker carries out said at least one objective work.

8. The managing apparatus according to claim 7, wherein the worker-intention-dependent determining portion further comprises a candidate selecting portion which selects, from the workers, at least one candidate who can carry out said at least one objective work, and
    wherein the pending-work-related informing portion informs each of said at least one candidate selected by the candidate selecting portion, of said at least one objective work.

9. The managing apparatus according to claim 1, wherein the worker determining portion determines said one worker at a time determined based on a time when said at least one objective work is carried out.

10. The managing apparatus according to claim 1, wherein the assisting-work occurrence information obtaining portion obtains a plurality of sets of said assisting-work occurrence information which are related to a plurality of assisting works, respectively,
    wherein the worker determining portion determines, in an order of priority of the assisting works, the workers who carry out the assisting works, respectively.

11. The managing apparatus according to claim 1, wherein the assisting-work occurrence information obtaining portion obtains a plurality of sets of said assisting-work occurrence information which are related to a plurality of assisting works, respectively,
    wherein the worker determining portion comprises a related-work-related determining portion which determines, as a plurality of objective works, a plurality of related works which are related to each other on carrying-out of the works, and determines said one worker who carries out the related works.

12. The managing apparatus according to claim 1, wherein the assisting-work occurrence information obtaining portion obtains a plurality of sets of said assisting-work occurrence information which are related to a plurality of assisting works, respectively,
    wherein the worker determining portion comprises a simultaneous-work-related determining portion which determines, as a plurality of objective works, a plurality of simultaneous works which are preferred to be carried out simultaneously with each other, and determines the workers who carry out the simultaneous works, respectively.

13. The managing apparatus according to claim 1, further comprising an assigned-work-related informing portion which informs said one worker determined by the worker determining portion, of said at least one objective work assigned to said one worker.

14. The managing apparatus according to claim 1, further comprising a plurality of portable terminal devices which can be carried by the workers, respectively,
    wherein the managing apparatus sends, and receives, information to, and from, the portable terminal devices carried by the workers.

15. A managing program for being implemented by a computer to manage an assisting work to assist a substrate-related-operation performing system comprising a plurality of substrate-related-operation performing machines each of which performs a substrate-related operation that is related to a circuit substrate, the assisting work being carried out, as needed, when the substrate-related-operation performing system is operated, and comprising at least one of a supplying work to supply a material or a part which is consumed or worn during the substrate-related operation, and a recovering work to remove a cause of a failure of at least one of the substrate-related-operation performing machines, the managing program assigning, each time a need to carry out the assisting work occurs, the assisting work to one of a plurality of workers,
    the managing program comprising
        obtaining, from the substrate-related-operation performing machines, assisting-work occurrence information which is related to occurrence of a need to carry out at least one assisting work and which represents an object and a sort of said at least one assisting work and a time to carry out said at least one assisting work; and
        determining, based on the obtained assisting-work occurrence information, one of the workers who is appropriate to carry out said at least one assisting work as at least one objective work, so that said at least one objective work is assigned to said one worker.

16. A recording medium on which the managing program according to claim 15 is recorded to be readable by a computer.

* * * * *